US012803609B2

(12) United States Patent
Wang et al.

(10) Patent No.: US 12,803,609 B2
(45) **Date of Patent: *Nov. 17, 2026**

(54) PHASED ARRAY TRANSMITTER

(71) Applicant: TRON FUTURE TECH INC., Hsinchu City (TW)

(72) Inventors: Yu-Jiu Wang, Hsinchu City (TW); Li Han Chang, Hsinchu City (TW); Hao-Chung Chou, Hsinchu City (TW); Ta-Shun Chu, Hsinchu City (TW)

(73) Assignee: TRON FUTURE TECH INC., Hsinchu City (TW)

( * ) Notice: Subject to any disclaimer, the term of this patent is extended or adjusted under 35 U.S.C. 154(b) by 52 days.

This patent is subject to a terminal disclaimer.

(21) Appl. No.: 18/952,977

(22) Filed: Nov. 19, 2024

(65) Prior Publication Data

US 2025/0080149 A1 Mar. 6, 2025

Related U.S. Application Data

(63) Continuation of application No. 17/811,313, filed on Jul. 8, 2022, now Pat. No. 12,355,477.

(Continued)

(51) Int. Cl.
*H04B 1/18* (2006.01)
*H03F 3/19* (2006.01)
(Continued)

(52) U.S. Cl.
CPC ................. *H04B 1/18* (2013.01); *H03F 3/19* (2013.01); *H04B 1/0078* (2013.01); *H04B 1/04* (2013.01);
(Continued)

(58) Field of Classification Search
CPC .......... H04B 1/18; H04B 1/0078; H04B 1/04; H04B 1/1615; H03F 3/19; H03F 2200/451
See application file for complete search history.

(56) References Cited

U.S. PATENT DOCUMENTS 5,034,752 A 7/1991 Pourailly et al.
11,476,953 B1 * 10/2022 Dionne .................. H04B 15/00
(Continued)

FOREIGN PATENT DOCUMENTS

CN 103457015 A 12/2013
CN 110931987 A 3/2020

OTHER PUBLICATIONS

Design of a Reflection-Type Phase Shifter With Wide Relative Phase Shift and Constant Insertion Loss, IEEE Transaction on Microwave Theory and Techniques, vol. 55, Sep. 2007, pp. 1862-1868.

(Continued)

*Primary Examiner* — Janice N Tieu
(74) *Attorney, Agent, or Firm* — WPAT, P.C.; Anthony King

(57) ABSTRACT

A phased array transmitter includes a plurality of signal couplers arranged to receive a radio frequency (RF) input signal, and a plurality of RF transmitters coupled to the signal couplers. Each RF transmitter includes a radiating element, a chip and a phase shifting circuit. The radiating element is arranged to receive a plurality of electrical signals to produce an RF output signal. An amplifier circuit of the chip is configured to amplify the RF input signal to generate
(Continued)

a plurality of amplified signals at a plurality of output terminals, respectively. The phase shifting circuit is located outside the chip, and coupled to the output terminals and the radiating element. The phase shifting circuit is arranged to phase shift the amplified signals, and accordingly generate the electrical signals fed to the radiating element. Respective phase shifting circuits and respective radiating elements of the RF transmitters are formed on a same substrate.

20 Claims, 31 Drawing Sheets

Related U.S. Application Data

(60) Provisional application No. 63/223,287, filed on Jul. 19, 2021.

(51) Int. Cl.
*H04B 1/00* (2006.01)
*H04B 1/04* (2006.01)
*H04B 1/16* (2006.01)

(52) U.S. Cl.
CPC ..... *H04B 1/1615* (2013.01); *H03F 2200/451* (2013.01)

(56) References Cited

U.S. PATENT DOCUMENTS

| | | | | | |
|---|---|---|---|---|---|
| 11,635,488 | B2 * | 4/2023 | Kohtani | G01S 7/352 | 342/173 |
| 2007/0259636 | A1 | 11/2007 | Fisher | | |
| 2012/0009720 | A1 * | 1/2012 | Shim | H10F 39/199 | 257/E31.127 |
| 2013/0201070 | A1 | 8/2013 | Parsche | | |
| 2014/0120852 | A1 | 5/2014 | Ashizuka | | |
| 2015/0255865 | A1 * | 9/2015 | Nishimoto | H01P 5/12 | 343/853 |
| 2015/0276919 | A1 * | 10/2015 | Matsumura | H01Q 1/3233 | 342/368 |
| 2018/0107091 | A1 * | 4/2018 | Hosseini | G02F 1/292 | |
| 2020/0313294 | A1 * | 10/2020 | Morita | H01Q 21/0025 | |

OTHER PUBLICATIONS

Office Action issued by CNIPA dated Apr. 30, 2025 for CN202210804698.7.
English Summary of the Office Action issued by CNIPA dated Apr. 30, 2025 for CN202210804698.7.
Search Report issued along with the Office Action issued by CNIPA dated Apr. 30, 2025 for CN202210804698.7.
English translation of the Search Report issued along with the Office Action issued by CNIPA dated Apr. 30, 2025 for CN202210804698.7.
English Abstract of CN110931987A.
Office Action issued by CNIPA dated Apr. 30, 2025 for CN202210804656.3.
English Summary of the Office Action issued by CNIPA dated Apr. 30, 2025 for CN202210804656.3.
Office Action issued by CNIPA dated Dec. 13, 2024 for CN202210804698.7.
English Summary of the Office Action issued by CNIPA dated Dec. 13, 2024 for CN202210804698.7.
Search Report issued along with the Office Action issued by CNIPA dated Dec. 13, 2024 for CN202210804698.7.
English translation of the Search Report issued along with the Office Action issued by CNIPA dated Dec. 13, 2024 for CN202210804698.7.
English Abstract of CN103457015A.
Office Action issued by CNIPA dated Dec. 6, 2024 for CN202210804656.3.
English Summary of the Office Action issued by CNIPA dated Dec. 6, 2024 for CN202210804656.3.
Search Report issued along with the Office Action issued by CNIPA dated Dec. 6, 2024 for CN202210804656.3.
English translation of the Search Report.

* cited by examiner

PHASED ARRAY TRANSMITTER

PRIORITY CLAIM AND CROSS-REFERENCE

The present application is a continuation of U.S. application Ser. No. 17/811,313 filed Jul. 8, 2022, which claims priority to U.S. Provisional Patent Application No. 63/223,287, filed on Jul. 19, 2021, which is incorporated by reference herein in its entirety.

BACKGROUND

The present disclosure relates to a phased array and, more particularly, to an array of radio frequency (RF) transmitters/receivers, each of which includes an I/Q phase shifter located outside a chip and formed on the same substrate as a corresponding antenna element.

Phased array antennas gain popularity for use in wireless communication such as 5G communication networks or low Earth orbit (LEO) satellite constellations. A phased array system can utilize beamforming and beamsteering techniques to form and steer the radiation pattern in various directions. For example, input power and relative phasing of each antenna in the phased array system can be controlled to change the direction and shape of radiated signals without any physical movement of the antenna. The radiation pattern is electronically steered according to the phase difference between the radiated signals. The phased array system can intelligently combine a number of individual antennas to achieve improved signal strength, gain and directivity. In addition, the phased array system can produce numbers of beams and realize a wide coverage, and is suited to LEO satellite constellations.

SUMMARY

The described embodiments provide a radio frequency (RF) transmitter having a phase shifter and a radiating element formed on a same substrate, a method for emitting an RF output signal, an RF receiver having a phase shifter and a radiating element formed on a same substrate, a method for receiving an RF input signal, and a related phased array.

Some embodiments described herein may include an RF transmitter. The RF transmitter includes a radiating element, a chip and a phase shifting circuit. The radiating element is arranged to receive a plurality of electrical signals to produce an RF output signal. The chip includes an amplifier circuit. The amplifier circuit is configured to amplify an RF input signal to generate a plurality of amplified signals at a plurality of output terminals, respectively. The phase shifting circuit is located outside the chip, and coupled to the output terminals and the radiating element. The phase shifting circuit is arranged to phase shift the amplified signals, and accordingly generate the electrical signals fed to the radiating element. The phase shifting circuit and the radiating element are formed on a same substrate.

Some embodiments described herein may include a method for emitting an RF output signal. The method includes: utilizing an amplifier circuit included in a chip to amplify an RF input signal to generate a plurality of amplified signals at a plurality of output terminals of the chip, respectively; generating a plurality of electrical signals by phase shifting the amplified signals outputted from the output terminals of the chip; and feeding the electrical signals to a radiating element to emit the RF output signal from the radiating element.

Some embodiments described herein may include a phased array transmitter. The phased array transmitter includes a plurality of signal couplers and a plurality of RF transmitters. The signal couplers are arranged to receive an RF input signal. The RF transmitters are coupled to the signal couplers. Each of the RF transmitters includes a radiating element, a chip and a phase shifting circuit. The radiating element is arranged to receive a plurality of electrical signals to produce an RF output signal. The chip has an amplifier circuit. The amplifier circuit is configured to amplify the RF input signal to generate a plurality of amplified signals at a plurality of output terminals, respectively. The phase shifting circuit, located outside the chip and coupled to the output terminals and the radiating element, is arranged to phase shift the amplified signals, and accordingly generate the electrical signals fed to the radiating element. Respective phase shifting circuits and respective radiating elements of the RF transmitters are formed on a same substrate.

With the use of the proposed technique for heterogeneous integration of active and passive devices on a phased array, phase shifting operation can be performed outside a chip, which thereby reduces the chip size. In addition, as the price of a substrate of the chip would be higher than that of a substrate where the radiating element is formed, reduction in chip size can help reduce the manufacturing costs. The proposed heterogeneous integration can further reduce signal loss resulting from signal transmission within the chip. Furthermore, the direction of rotation of a circularly polarized wave that an RF transmitter/receiver can emit/receive is selectable.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
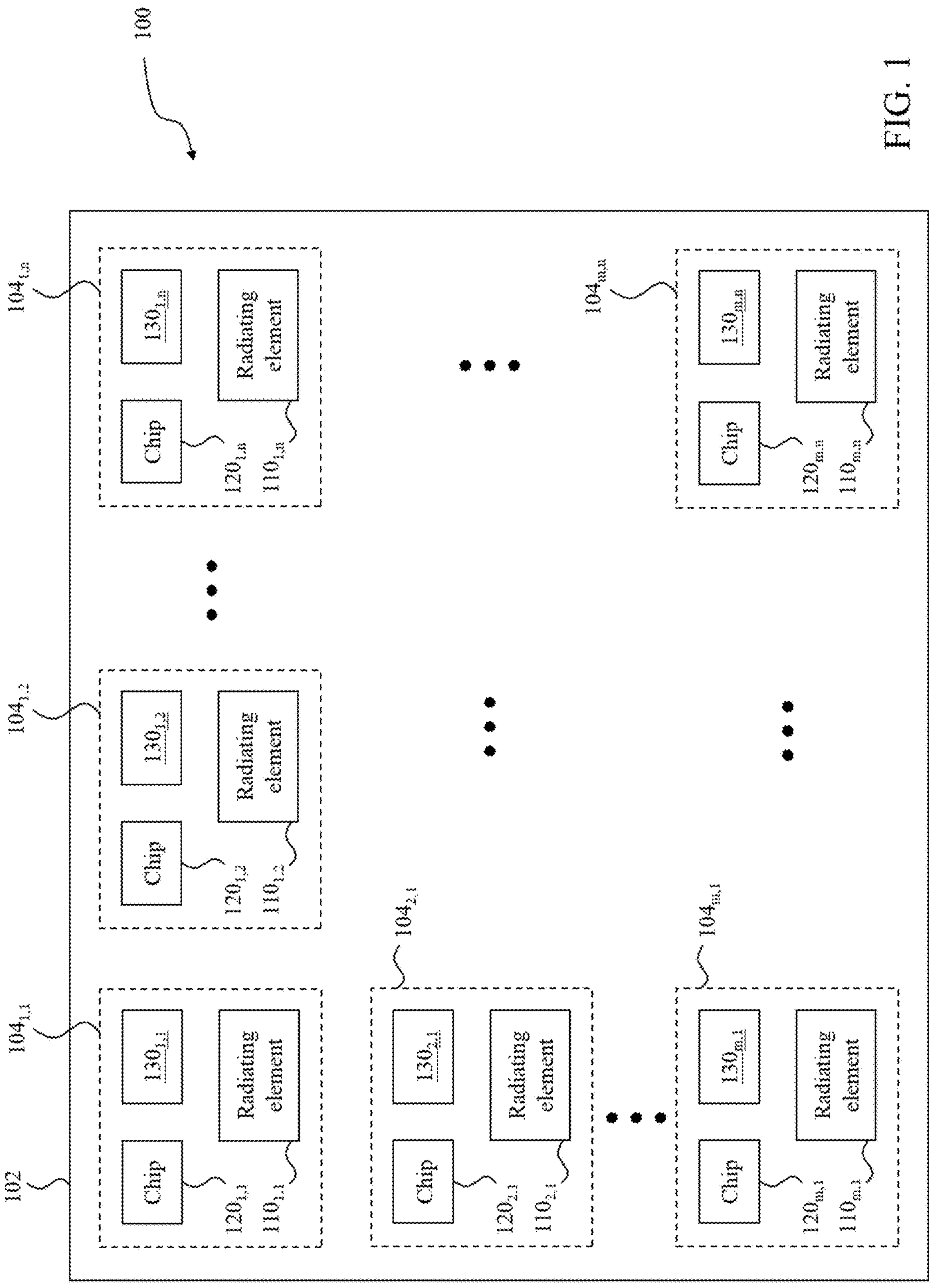
FIG. 1 is a diagram illustrating an exemplary phased array in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

A phased array may employ in-phase/quadrature (I/Q) phase shifters to emit or receive polarized electromagnetic waves, such as circularly polarized electromagnetic waves. Each I/Q phase shifter, formed within an integrated circuit (IC) or a chip, is configured to introduce a 90° phase shift between an in-phase path (I-path) and a quadrature path (Q-path) thereof. At a transmitting end, the resulting phase shifted signals can be amplified and sent to an antenna element for emitting a polarized electromagnetic wave.

For example, in a phased array configured as an array of transmitters, each transmitter includes a chip and an antenna element. The chip may include an active two-way splitter, an I/Q generator, two variable gain amplifiers (VGAs), a signal adder and a power amplifier (PA). The active two-way splitter is arranged to split a radio frequency (RF) input signal into two input signals. The I/Q generator receives one input signal through one of an I-path and a Q-path, and produces a phase shifted signal which lags by one-eighth wavelength (e.g. −45°) behind the input signal. The I/Q generator further receives the other input signal through the other of the I-path and the Q-path, and produces another phase shifted signal which leads the other input signal by one-eighth wavelength (e.g. +45°). The phase shifted signals having a phase difference of 90° are inputted to the VGAs respectively. The signal adder is arranged to add up two signals outputted from the VGAs to produce a phase shifted version of the RF input signal, which is sent to the PA to generate an amplified signal. Next, the amplified signal is fed to two feeding points of the antenna element through two transmission lines, a length difference between which is equal to a quarter wavelength. The antenna element can emit a circularly polarized electromagnetic wave according to signals at the two feeding points.

However, incorporating multiple circuit elements into the chip increases the chip size and costs. In addition, the I/Q phase shifter (i.e. the I/Q generator) are vulnerable to signal loss within the chip. Furthermore, as the signals at the two feeding points have a fixed phase difference such as +90°, the electromagnetic wave emitted from the antenna element is circularly polarized in a fixed direction such as a clockwise or counter-clockwise direction.

A phased array configured as an array of receivers would encounter similar problems. For example, each receiver includes a chip and an antenna element. The chip includes a low noise amplifier (LNA), an active two-way splitter, two VGAs, an I/Q generator and a signal adder. When the antenna element receives a circularly polarized electromagnetic wave, respective signals outputted from two feeding points of the antenna element can have a phase difference of 90°. The signals outputted from the two feeding points are inputted to the LNA through two transmission lines respectively. A length difference between the two transmission lines is equal to a quarter wavelength. Thus, the two transmission lines can compensate the 90° phase difference, and the signals outputted from the two feeding points can be added up in phase at an input terminal of the LNA. The active two-way splitter is arranged to split an output of the LNA into two input signals. The VGAs are arranged to amplify the two input signals to generate two amplified signals, respectively. The I/Q generator receives the amplified signals through an I-path and a Q-path respectively, and accordingly produces two phase shifted signals. The signal adder is arranged to add up the phase shifted signals, and the resulting signal is sent to an output buffer to accomplish the subsequent operation.

Similarly, incorporating multiple circuit elements into the chip increases the chip size and costs. The I/Q phase shifter (i.e. the I/Q generator) are vulnerable to signal loss. An electromagnetic wave that the receiver can receive is circularly polarized in a fixed direction such as a clockwise or counter-clockwise direction.

The present disclosure describes exemplary phased arrays, each of which includes array elements implemented as RF transmitters or RF receivers. Each array element, i.e. an RF transmitter/receiver, includes a phase shifting circuit and a radiating element formed on a same substrate. For example, the phase shifting circuit may include an I/Q phase shifter formed outside a chip, which includes an amplifier circuit or other active circuit elements. The chip may be heterogeneously integrated onto the substrate where the phase shifting circuit and the radiating element are formed. In some embodiments, the chip may include a semiconductor substrate, upon which or within which active circuit elements are formed/attached. The phase shifting circuit and the radiating element are formed on a portion of the substrate, and the semiconductor substrate is heterogeneously integrated onto another portion of the substrate. In some embodiments, the phase shifting circuit and the radiating element can be formed on a printed circuit board (PCB), a glass substrate, an insulating substrate, or multiple types of passive substrates where passive circuit elements are formed/attached. Integrating the phase shifting circuit and the radiating element onto the same substrate can reduce the chip size and costs, and alleviate signal attenuation. Further description is provided below.

FIG. 1 is a diagram illustrating an exemplary phased array in accordance with some embodiments of the present disclosure. The phased array 100 includes a substrate 102 and a plurality of array elements $\mathbf{104}_{1,1}$-$\mathbf{104}_{m,n}$ arranged in m rows and n columns, where m and n are positive integers.

Each array element is disposed on the substrate 102, and can be implemented as an RF transmitter or an RF receiver. Each array element includes, but is not limited to, a radiating element, a chip and a phase shifting circuit. In some embodiments, the chip may include active devices such as an amplifier circuit. A substrate of the chip may be referred to as an active substrate, on which active devices or active circuit elements are formed/fabricated. In some embodiments, each of the radiating element and the phase shifting circuit is formed on the substrate 102 and implemented using passive devices. The substrate 102 may be referred to as a passive substrate.

For example, the array element $\mathbf{104}_{1,1}$ includes a radiating element $\mathbf{110}_{1,1}$, a chip $\mathbf{120}_{1,1}$ and a phase shifting circuit $\mathbf{130}_{1,1}$. The radiating element $\mathbf{110}_{1,1}$ may be implemented using an antenna element such as a microstrip antenna or a printed antenna. The chip $\mathbf{120}_{1,1}$ may be implemented using a semiconductor chip that includes a semiconductor substrate. The chip $\mathbf{120}_{1,1}$ includes an amplifier circuit, which includes but is not limited to at least one VGA, at least one PA or at least one LNA. The phase shifting circuit $\mathbf{130}_{1,1}$ may be implemented using passive devices, such as transmission lines or microstrip couplers. The substrate 102 may be implemented using a PCB, a glass substrate or multiple types of insulating substrates. The chip $\mathbf{120}_{1,1}$ or the semiconductor substrate thereof can be heterogeneously integrated onto the substrate 102.

Figure 2A:
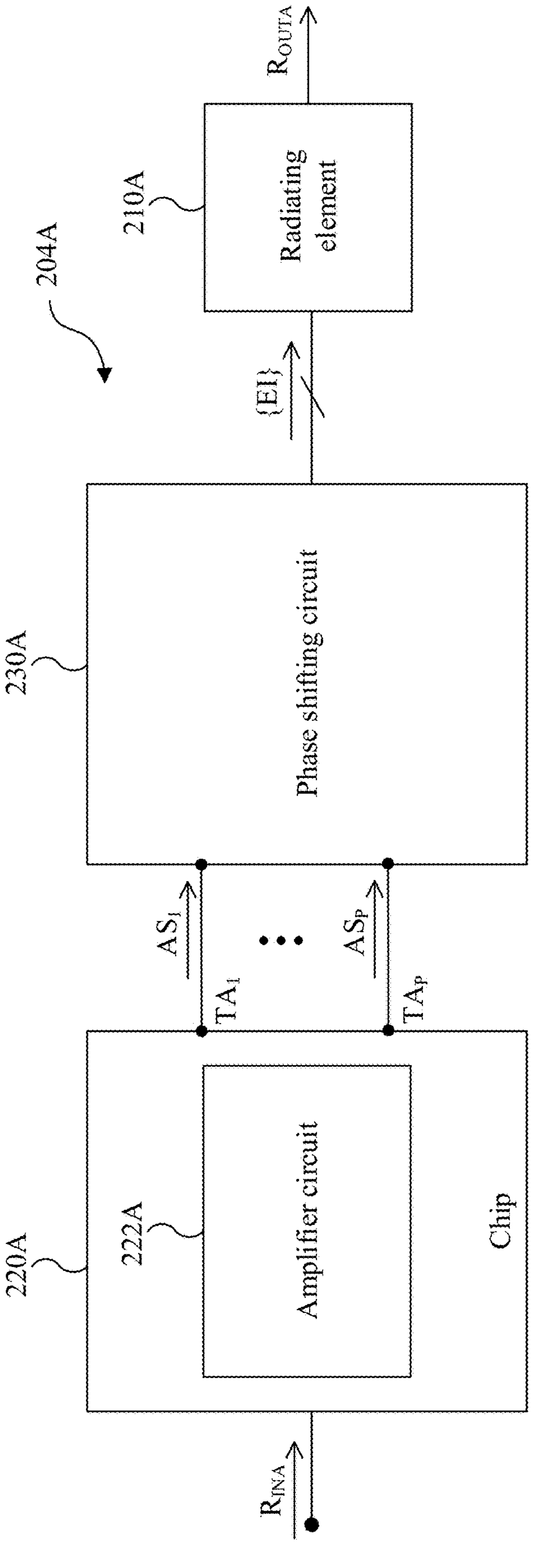
FIG. 2A is a block diagram illustrating an exemplary RF transmitter in accordance with some embodiments of the present disclosure.

When employed at a transmitting end, the phased array 100 can be implemented as a phased array transmitter. Each of the array elements $\mathbf{104}_{1,1}$-$\mathbf{104}_{m,n}$ can be implemented as an RF transmitter. Each of the radiating elements $\mathbf{110}_{1,1}$-$\mathbf{110}_{m,n}$ can be referred to as a transmitter antenna, which is configured to emit electromagnetic waves. Referring to FIG. 2A and also to FIG. 1, the RF transmitter 204A can be used to implement at least one of the array elements $\mathbf{104}_{1,1}$-$\mathbf{104}_{m,n}$ in some embodiments where the phased array 100 is implemented as a phased array transmitter. The RF transmitter 204A is configured to emit an RF output signal $R_{OUTA}$ according to an RF input signal $R_{INA}$.

In the example of FIG. 2A, the RF transmitter 204A can serve as an embodiment of the array element $\mathbf{104}_{1,1}$. The RF transmitter 204A includes a radiating element 210A, a chip 220A and a phase shifting circuit 230A, which can serve as respective embodiments of the radiating element $\mathbf{110}_{1,1}$, the chip $\mathbf{120}_{1,1}$ and the phase shifting circuit $\mathbf{130}_{1,1}$. The radiating element 210A is arranged to receive a plurality of electrical signals {EI} to produce the RF output signal $R_{OUTA}$. For example, the radiating element 210A may be implemented using a dual-feed antenna. The radiating element 210A can receive the electrical signals {EI} through two feeding points thereof, and accordingly produce the RF output signal $R_{OUTA}$. As another example, the radiating element 210A may be implemented using a four-feed antenna. The radiating element 210A can receive the electrical signals {EI} through four feeding points thereof, and accordingly produce the RF output signal $R_{OUTA}$.

The chip 220A includes an amplifier circuit 222A, which can be configured to amplify the RF input signal $R_{INA}$ to generate a plurality of amplified signals $AS_1$-$AS_P$ at a plurality of output terminals $TA_1$-$TA_P$, respectively. P is an integer greater than one. For example, the amplifier circuit 222A can amplify the RF input signal $R_{INA}$ with P gain values to generate the amplified signals $AS_1$-$AS_P$, respectively. In some embodiments, at least one of the P gain values is adjustable.

The phase shifting circuit 230A is located outside the chip 220A, and is coupled to the output terminals $TA_1$-$TA_P$ and the radiating element 210A. The phase shifting circuit 230A is arranged to phase shift the amplified signals $AS_1$-$AS_P$, and accordingly generate the electrical signals {EI} fed to the radiating element 210A. The phase shifting circuit 230A and the radiating element 210A are formed on the same substrate. Note that as the phase shifting circuit 230A can be responsible for associated phase shifting operation, the chip 220A would not need to reserve space for implementing an I/Q phase shifter. The chip 220A can have a smaller size than a chip incorporating an I/Q phase shifter.

Figure 2B:
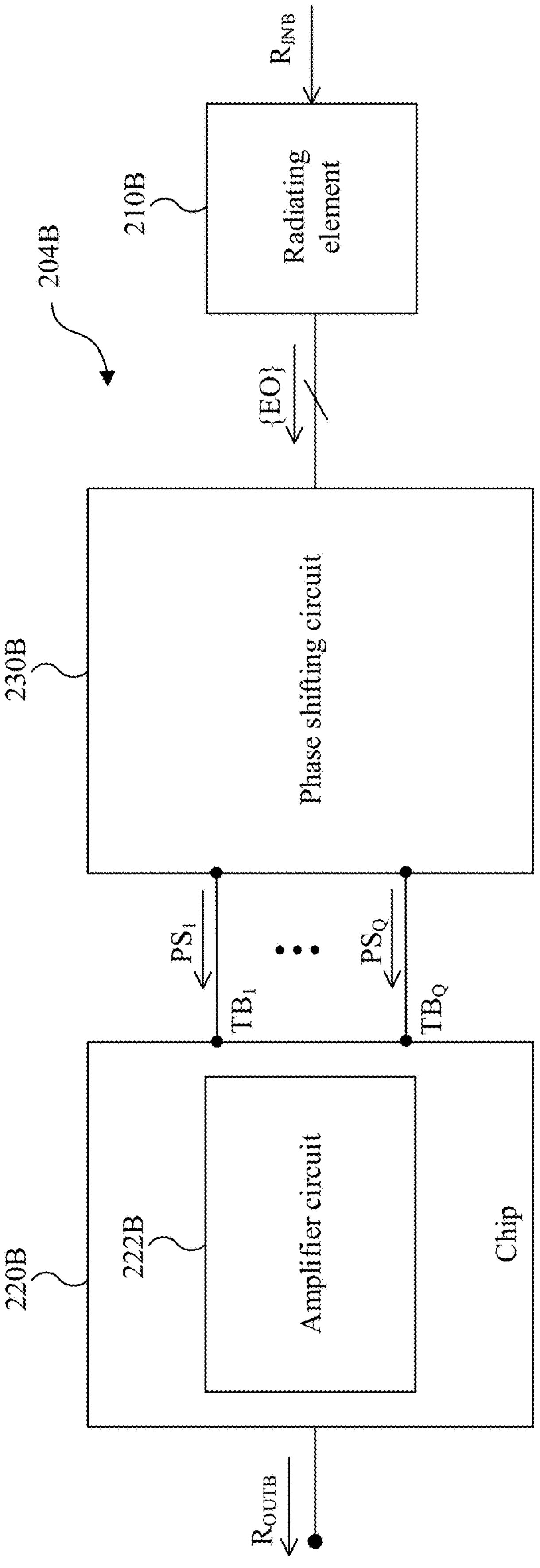
FIG. 2B is a block diagram illustrating an exemplary RF receiver in accordance with some embodiments of the present disclosure.

In some embodiments, the phased array 100 can be implemented as a phased array receiver when employed at a receiving end. Each of the array elements $\mathbf{104}_{1,1}$-$\mathbf{104}_{m,n}$ can be implemented as an RF receiver. Each of the radiating elements $\mathbf{110}_{1,1}$-$\mathbf{110}_{m,n}$ can be referred to as a receiver antenna, which is configured to receive electromagnetic waves. Referring to FIG. 2B and also to FIG. 1, the RF receiver 204B can be used to implement at least one of the array elements $\mathbf{104}_{1,1}$-$\mathbf{104}_{m,n}$ in some embodiments where the phased array 100 is implemented as a phased array receiver. The RF receiver 204B is configured to receive an RF input signal $R_{INB}$ to produce an RF output signal $R_{OUTB}$.

In the example of FIG. 2B, the RF receiver 204B can serve as an embodiment of the array element $\mathbf{104}_{1,1}$. The RF receiver 204B may include a radiating element 210B, a chip 220B and a phase shifting circuit 230B, which can serve as respective embodiments of the radiating element $\mathbf{110}_{1,1}$, the chip $\mathbf{120}_{1,1}$ and the phase shifting circuit $\mathbf{130}_{1,1}$. The radiating element 210B is arranged to receive the RF input signal $R_{INB}$ to produce a plurality of electrical signals {EO}. For example, the radiating element 210B may be implemented using a dual-feed antenna. The radiating element 210B can receive the RF input signal $R_{INB}$ and output the electrical signals {EO} at two feeding points thereof. As another example, the radiating element 210B may be implemented using a four-feed antenna. The radiating element 210B can receive the RF input signal $R_{INB}$ and output the electrical signals {EO} at four feeding points thereof.

The chip 220B includes an amplifier circuit 222B, which can be configured to receive a plurality of phase shifted signals $PS_1$-$PS_Q$ from a plurality of input terminals $TB_1$-$TB_Q$ respectively. Q is an integer greater than one. In addition, the amplifier circuit 222B is configured to amplify the phase shifted signals $PS_1$-$PS_Q$ to generate the RF output signal $R_{OUTB}$. For example, the amplifier circuit 222B can generate the RF output signal $R_{OUTB}$ by amplifying the phase shifted signals $PS_1$-$PS_Q$ with Q gain values, respectively. In some embodiments, at least one of the Q gain values is adjustable.

The phase shifting circuit 230B is located outside the chip 220B, and is coupled to the radiating element 210B and the input terminals $TB_1$-$TB_Q$. The phase shifting circuit 230B can be arranged to phase shift the electrical signals {EO} and accordingly generate the phase shifted signals $PS_1$-$PS_Q$. Similarly, as the phase shifting circuit 230B can be responsible for associated phase shifting operation, the chip 220B would not need to reserve space for implementing an I/Q phase shifter. The chip 220B can have a smaller size than a chip incorporating an I/Q phase shifter.

With the use of the proposed technique for heterogeneous integration of active and passive devices on a phased array, phase shifting operation can be performed outside a chip, which thereby reduces the chip size. In addition, as the price of a substrate of the chip would be higher than that of a substrate where the radiating element is formed, reduction in chip size can help reduce the manufacturing costs. Furthermore, the proposed heterogeneous integration can reduce signal loss resulting from signal transmission within the chip.

To facilitate understanding of the present disclosure, some embodiments are given below for further description of the proposed heterogeneous integration. However, these embodiments are provided for illustrative purposes, and are not intended to limit the scope of the present disclosure. As long as a transmitter/receiver of a phased array includes a phase shifting circuit located outside a chip and responsible for I/Q phase shifting operation, and the phase shifting circuit is formed on the same substrate as a corresponding antenna element, associated modifications and alternatives are contemplated to fall within the scope of the present disclosure.

Figure 3:
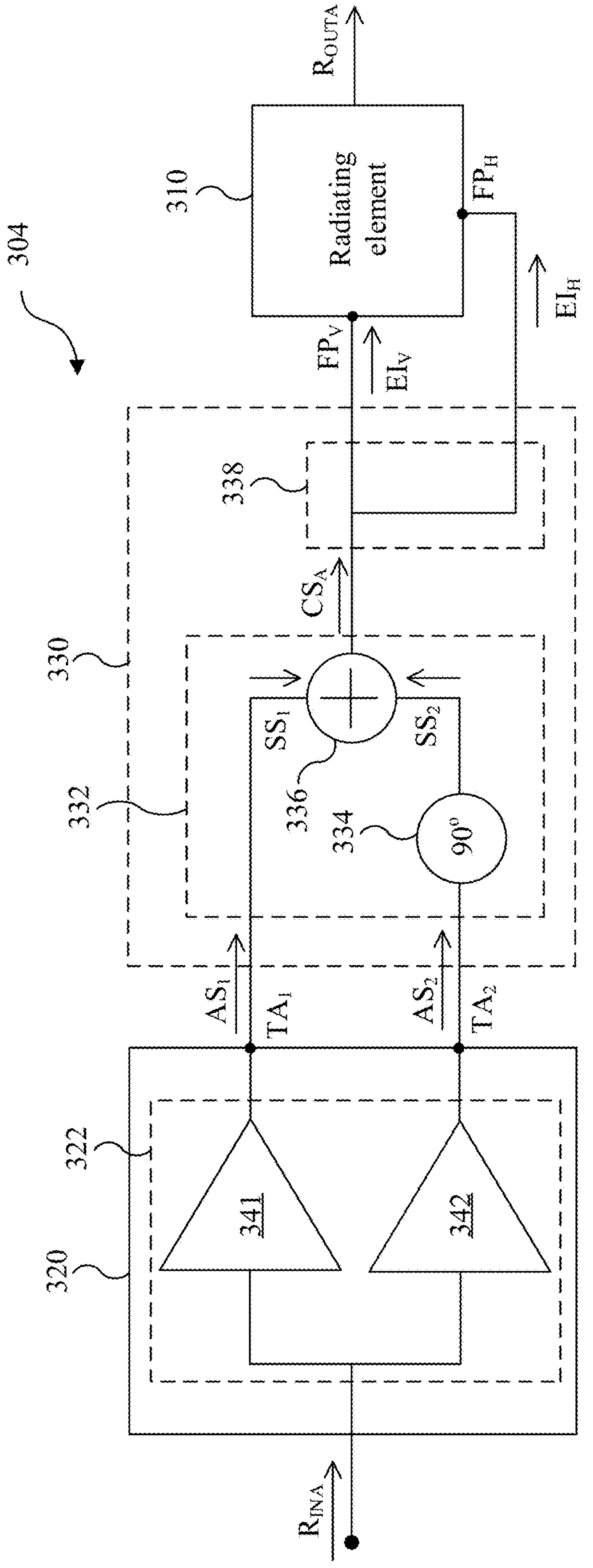
FIG. 3 to FIG. 5 illustrate implementations of the RF transmitter shown in FIG. 2A in accordance with some embodiments of the present disclosure.
Figure 4:
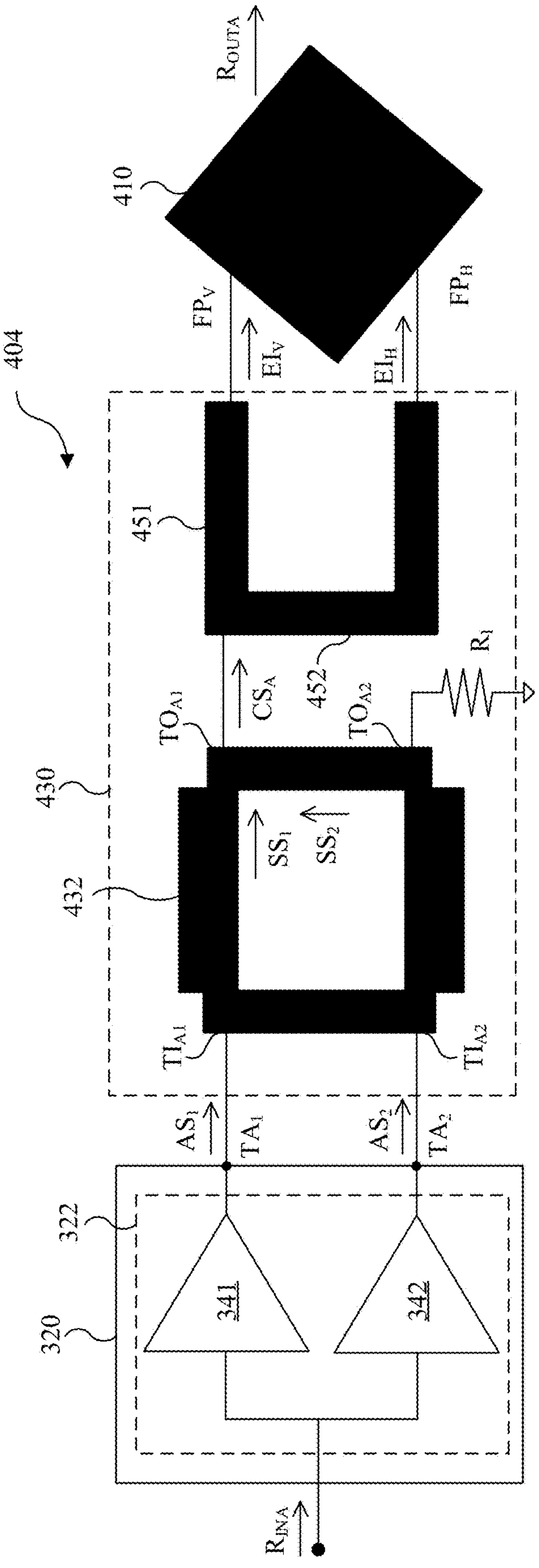
Figure 5:
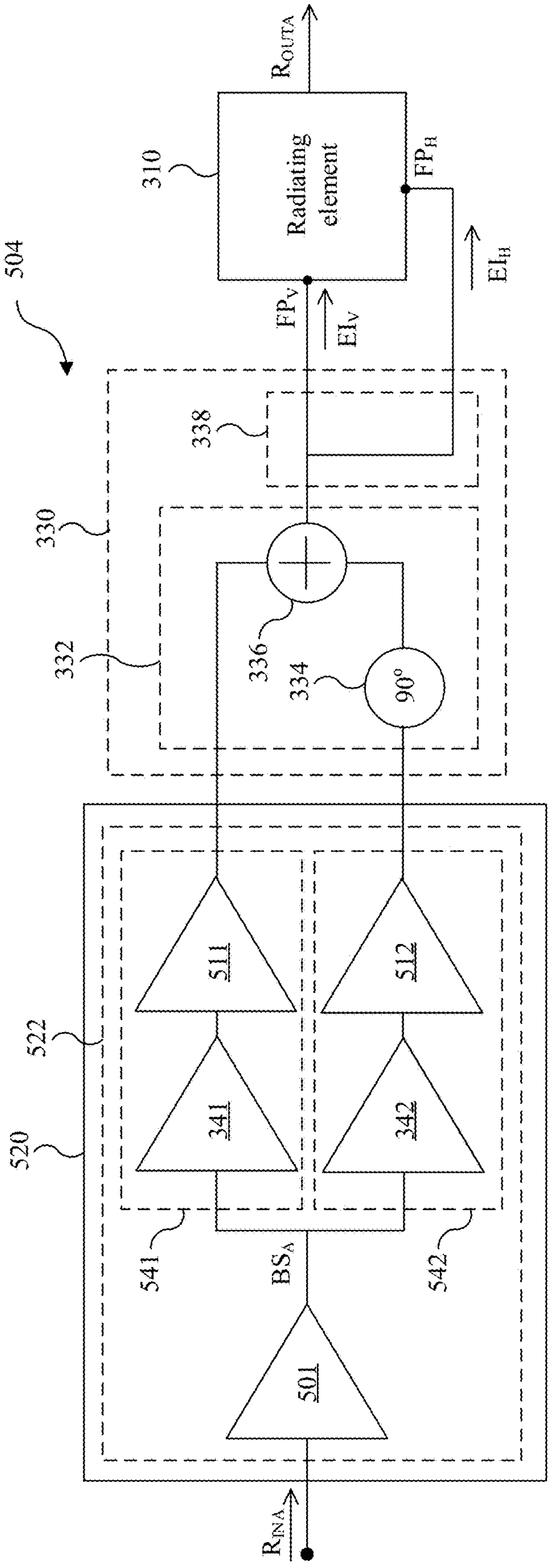
Figure 6:
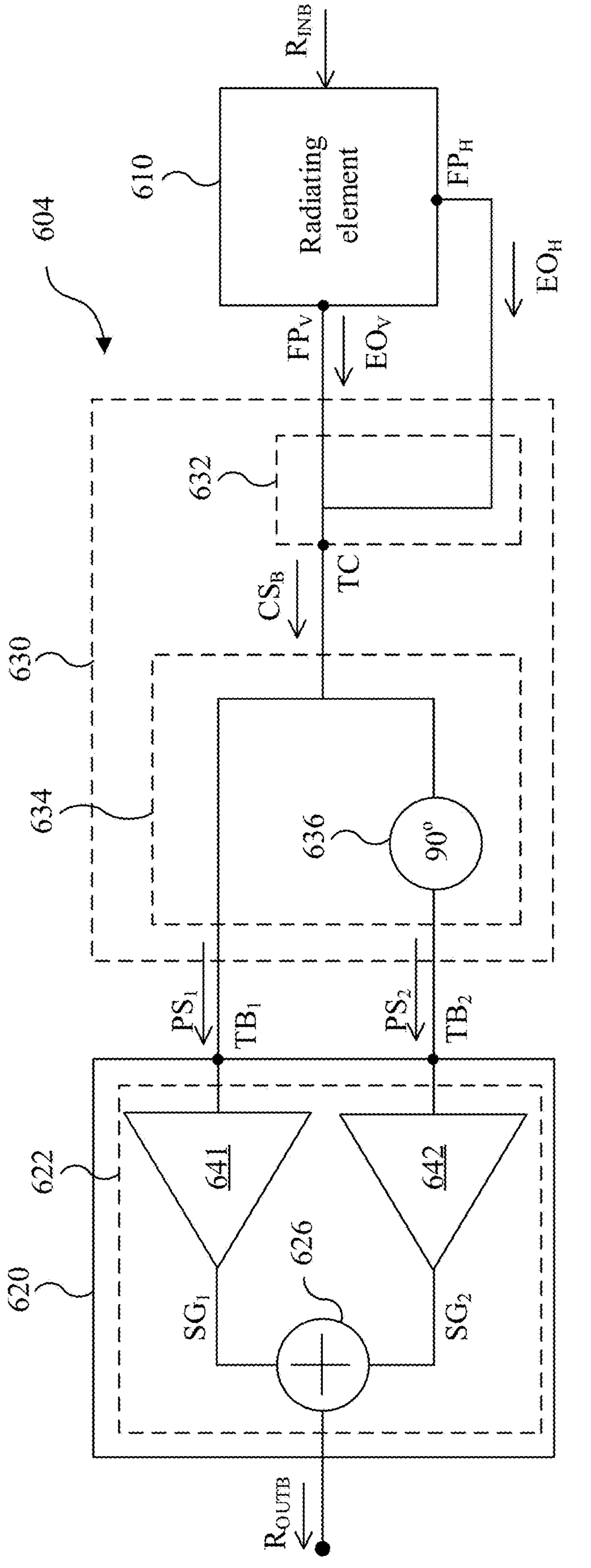
FIG. 6 to FIG. 8 illustrate implementations of the RF receiver shown in FIG. 2B in accordance with some embodiments of the present disclosure.
Figure 7:
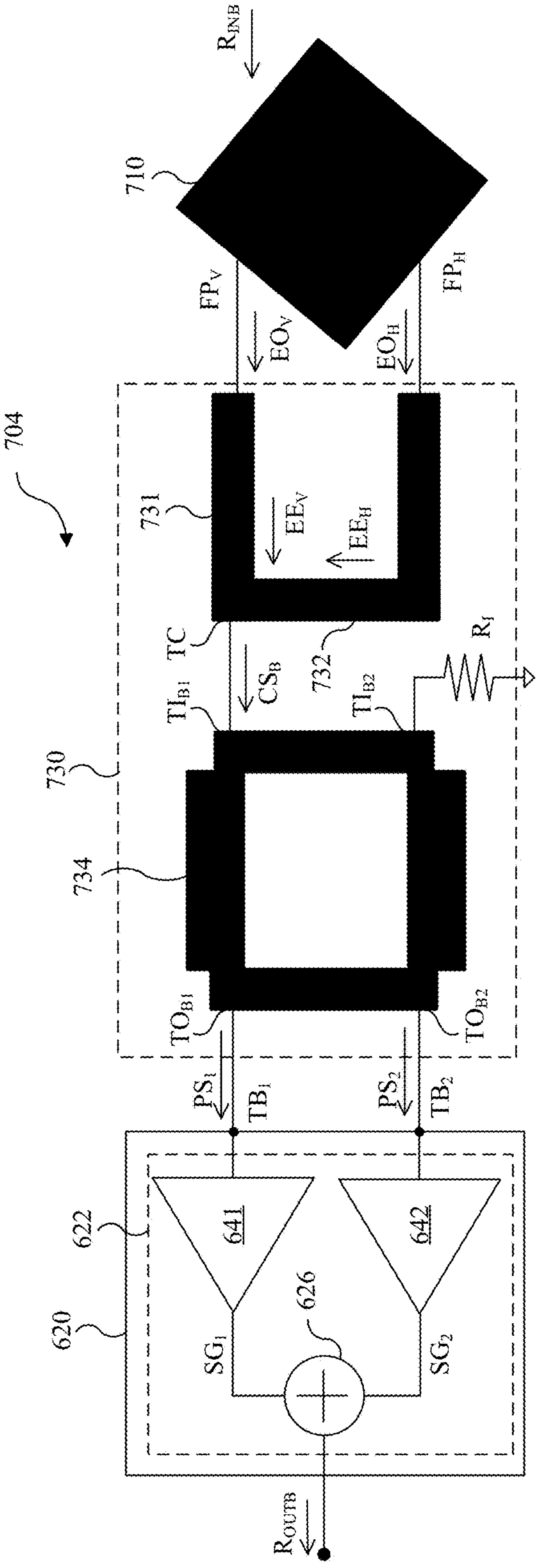
Figure 8:
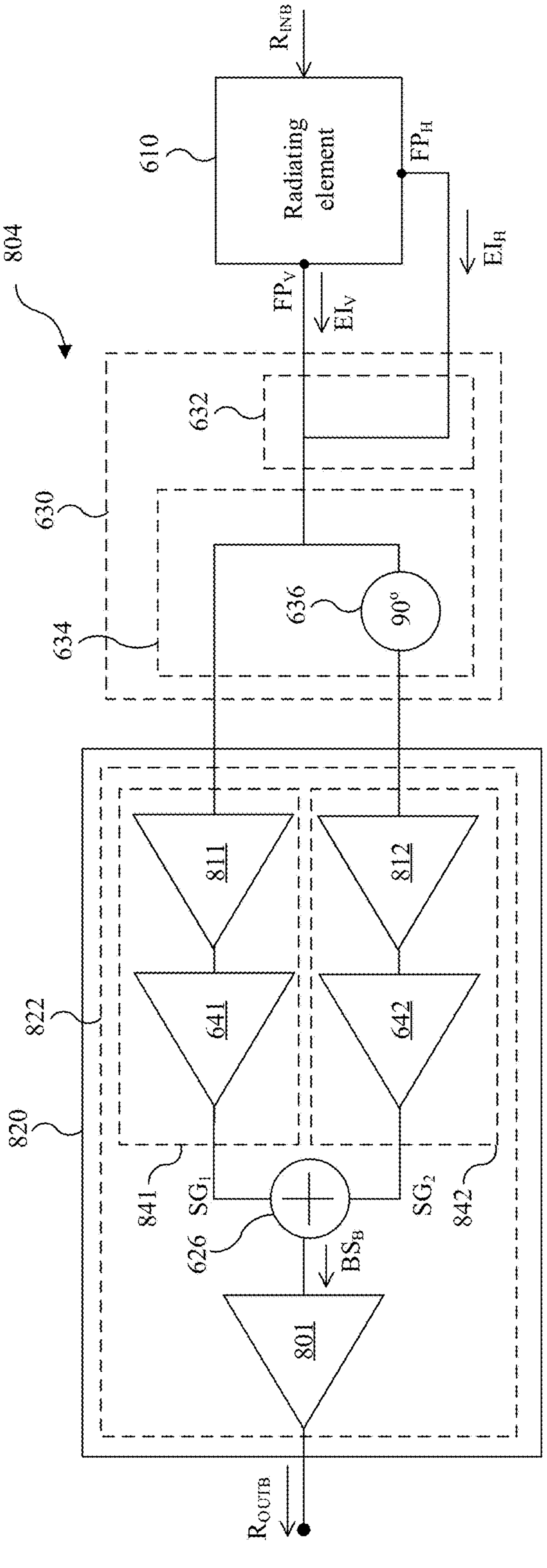

FIG. 3 to FIG. 5 illustrate implementations of the RF transmitter 204A shown in FIG. 2A in accordance with some embodiments of the present disclosure. FIG. 6 to FIG. 8 illustrate implementations of the RF receiver 204B shown in FIG. 2B in accordance with some embodiments of the present disclosure. In the embodiments shown in FIG. 3 to FIG. 8, a radiating element included in the RF transmitter/receiver is implemented using an antenna element with two feeding points.

Referring firstly to FIG. 3, the RF transmitter 304 can represent an embodiment of the RF transmitter 204A shown in FIG. 2A. The RF transmitter 304 includes a radiating element 310, a chip 320 and a phase shifting circuit 330, which can represent embodiments of the radiating element 210A, the chip 220A and the phase shifting circuit 230A shown in FIG. 2A respectively. In the example of FIG. 3, the radiating element 310 is implemented to include two feeding points $FP_V$ and $FP_H$. The feed point $FP_V$ is arranged to receive an electrical signal $EI_V$, and the feed point $FP_H$ is arranged to receive an electrical signal $EI_H$. The electrical signals $EI_V$ and $EI_H$ may be of equal amplitude, and have a phase difference of 90°. The radiating element 310 can receive the electrical signals $EI_V$ and $EI_H$ to produce a circularly polarized electromagnetic wave, i.e. the RF output signal $R_{OUTA}$.

The chip 320 includes an amplifier circuit 322, which is configured to amplify the RF input signal $R_{INA}$ to generate two amplified signals $AS_1$ and $AS_2$. By way of example but not limitation, the amplifier circuit 322 may include two amplifiers 341 and 342, each of which can be implemented using a VGA. The RF input signal $R_{INA}$ can be split into two input signals that are in phase. By amplifying a corresponding input signal split from the RF input signal $R_{INA}$, each of the amplifiers 341 and 342 can amplify the RF input signal $R_{INA}$ and accordingly generate a corresponding amplified signal.

The phase shifting circuit 330 includes a plurality of phase shifting stages 332 and 338. The phase shifting stage 332, coupled to the output terminals $TA_1$ and $TA_2$ of the chip 320, is configured to phase shift at least one of the amplified signals $AS_1$ and $AS_2$ to produce phase shifted signals $SS_1$ and $SS_2$ having a phase difference of 90°. The phase shifting stage 332 may combine the phase shifted signals $SS_1$ and $SS_2$ to generate a combined signal $CS_A$. By way of example but not limitation, the phase shifting stage 332 may include a phase shifter 334 and a signal combiner 336, also referred to as a signal adder. The phase shifter 334 can be configured to shift a phase of the amplified signal $AS_2$ by 90° and produce the phase shifted signal $SS_2$. The signal combiner 336 can be configured to combine the phase shifted signal $SS_1$ and the phase shifted signal $SS_2$ to generate the combined signal $CS_A$.

In the present embodiment, as no phase shifter is illustrated between the amplifier 341 and the signal combiner 336, the amplified signal $AS_1$ can serve as the phase shifted signal $SS_1$. However, this is provided for illustrative purposes, and is not intended to limit the scope of the present disclosure. In some embodiments, a phase shifter may be provided between the amplifier 341 and the signal combiner 336 as long as phase shifted signals $SS_1$ and $SS_2$ can have a phase difference of 90°. For example, the phase shifter located between the amplifier 341 and the signal combiner 336 may provide a first phase shift amount, and the phase shifter 334 may provide a second phase shift amount. The sum of the first and second phase shift amounts may be equal to or substantially equal to 90°.

The phase shifting stage 338, coupled to the phase shifting stage 332, is configured to phase shift the combined signal $CS_A$ to produce the electrical signals $EI_V$ and $EI_H$. By way of example but not limitation, the phase shifting stage 338 may be implemented using two transmission lines of different lengths. One transmission line is arranged for transmitting the combined signal $CS_A$ to produce the electrical signal $EI_V$. The other transmission line is arranged for transmitting the combined signal $CS_A$ to produce the electrical signal $EI_H$. The radiating element 310 can generate a vertical component of the RF output signal $R_{OUTA}$ (e.g. a vertical polarization component) according to the electrical signal $EI_V$, and generate a horizontal component of the RF output signal $R_{OUTA}$ (e.g. a horizontal polarization component) according to the electrical signal $EI_H$.

FIG. 4 illustrates an implementation of the RF transmitter 304 shown in FIG. 3 in accordance with some embodiments of the present disclosure. The RF transmitter 404 includes the chip 320 shown in FIG. 3, a radiating element 410 and a phase shifting circuit 430. The radiating element 410 is implemented using a dual-feed patch antenna, and can serve as an embodiment of the radiating element 310 shown in FIG. 3. The phase shifting circuit 430 may include a branch-line coupler 432 and transmission lines 451 and 452. The branch-line coupler 432 can serve as an embodiment of the phase shifting stage 332 shown in FIG. 3. The transmission lines 451 and 452 can serve as an embodiment of the phase shifting stage 338 shown in FIG. 3. Note that the branch-line coupler 432 and each transmission line can be implemented using, but are not limited to, microstrip lines. In some cases where the radiating element 410 is implemented using a microstrip antenna, the branch-line coupler 432, the transmission lines 451 and 452, and the radiating element 410 can be simultaneously formed on a passive substrate outside the chip 320.

In the present embodiment, the branch-line coupler 432 includes two input terminals $TI_{A1}$ and $TI_{A2}$, and two output terminals $TO_{A1}$ and $TO_{A2}$. The input terminals $TI_{A1}$ and $TI_{A2}$ are arranged to receive the amplified signals $AS_1$ and $AS_2$ respectively. The output terminal $TO_{A1}$ is arranged to output the combined signal $CS_A$, and the output terminal $TO_{A2}$ is isolated. For example, the output terminal $TO_{A2}$ is coupled to an isolation resistor $R_I$.

The transmission line 451, coupled to the output terminal $TO_{A1}$, is arranged to couple the combined signal $CS_A$ to the radiating element 410 and accordingly generate the electrical signal $EI_V$. The transmission line 452, coupled to the output terminal $TO_{A1}$, is arranged to couple the combined signal $CS_A$ to the radiating element 410 and accordingly generate the electrical signal $EI_H$. In the embodiment shown in FIG. 4, the length of the transmission line 452 is greater than the length of the transmission line 451. A phase difference between the electrical signals $EI_V$ and $EI_H$ can be determined/adjusted according to the length difference between the transmission lines 451 and 452. For example, the length difference between the transmission lines 451 and 452 may be equal to a quarter wavelength or an odd multiple of the quarter wavelength. The electrical signals $EI_V$ and $EI_H$ can have a phase difference of 90° accordingly.

In operation, the branch-line coupler 432 can couple the amplified signals $AS_1$ and $AS_2$ to the output terminal $TO_{A1}$ to thereby produce the phase shifted signals $SS_1$ and $SS_2$. The phase shifted signals $SS_1$ and $SS_2$ are combined at the output terminal $TO_{A1}$ to produce the combined signal $CS_A$. The branch-line coupler 432 can act as a 90° phase shifter in combination with a signal combiner. Next, each of the transmission lines 451 and 452 can couple the combined signal $CS_A$ to the radiating element 410 to thereby produce the electrical signals $EI_V$ and $EI_H$, which are of equal amplitude and have a phase difference of 90°. The transmission lines 451 and 452 can act as another 90° phase shifter. The radiating element 410 can produce a right-hand circularly polarized (RHCP) or left-hand circularly polarized (LHCP) wave according to the electrical signals $EI_V$ and $EI_H$.

Note that the phase shifting circuit 430, e.g. two phase shifters, can be designed in conjunction with the radiating element 410 rather than active devices of the chip 320. In other words, the branch-line coupler 432, the transmission lines 451 and 452, and the radiating element 410 can be formed or layouted on a passive substrate. The chip arca would be reserved for active devices (e.g. active amplifiers which occupy a relatively small area) rather than a phase shifter. Thus, the proposed technique for heterogeneous integration of active and passive devices on a phased array transmitter can reduce not only the chip size and manufacturing costs, but also signal attenuation and power consumption.

The structures shown in FIG. 3 and FIG. 4 are provided for illustrative purposes only, and are not intended to limit the scope of the present disclosure. In some embodiments, the phase shifting stage 332 shown in FIG. 3 may be implemented using transmission lines of different lengths, such as the transmission lines 451 and 452 shown in FIG. 4. In some embodiments, the phase shifting stage 338 shown in FIG. 3 may be implemented using a branch-line coupler, such as the branch-line coupler 432 shown in FIG. 4.

In some embodiments, the amplifier circuit 322 shown in FIG. 3 may include other circuit elements. Referring to FIG. 5, the RF transmitter 504 can represent another embodiment of the RF transmitter 204A shown in FIG. 2A. The structure of the RF transmitter 504 is similar/identical to the structure of the RF transmitter 304 shown in FIG. 3 except for the chip 520. In the present embodiment, the amplifier circuit 522 in the chip 520 includes a buffer 501 and amplifier paths 541 and 542.

The buffer 501 is configured to buffer the RF input signal $R_{INA}$ to generate a buffered signal $BS_A$, i.e. a buffered version of the RF input signal $R_{INA}$. The amplifier path 541 is configured to amplify the buffered signal $BS_A$ to generate the amplified signal $AS_1$. The amplifier path 542 is configured to amplify the buffered signal $BS_A$ to generate the amplified signal $AS_2$. In the present embodiment, the amplifier path 541 includes the amplifier 341 shown in FIG. 3 and an amplifier 511. The amplifier path 542 includes the amplifier 342 shown in FIG. 3 and an amplifier 512. Each of the amplifiers 511 and 512 can be implemented using a power amplifier (PA). As those skilled in the art can appreciate the operation of the RF transmitter 504 shown in FIG. 5 after reading the above paragraphs directed to FIG. 1 to FIG. 4, further description is omitted here for brevity.

FIG. 6 is a diagram illustrating an implementation of the RF receiver 204B shown in FIG. 2B in accordance with some embodiments of the present disclosure. The RF receiver 604 includes a radiating element 610, a chip 620 and a phase shifting circuit 630, which can represent embodiments of the radiating element 210B, the chip 220B and the phase shifting circuit 230B shown in FIG. 2B respectively. In the example of FIG. 6, the radiating element 610 is implemented to include two feeding points $FP_V$ and $FP_H$. The feed point $FP_V$ is arranged to output an electrical signal $EO_V$, and the feed point $FP_H$ is arranged to receive an electrical signal $EO_H$. The electrical signals $EO_V$ and $EO_H$ may be of equal amplitude, and have a phase difference of 90°. For example, the radiating element 610 can receive a circularly polarized electromagnetic wave, i.e. the RF input signal $R_{INB}$, to produce the electrical signals $EO_V$ and $EO_H$. The electrical signals $EO_V$ and $EO_H$ may be produced in response to a vertical component and a horizontal component of the RF input signal $R_{INB}$, respectively.

The chip 620 includes an amplifier circuit 622, which is configured to receive two phase shifted signals $PS_1$ and $PS_2$ from two input terminals $TB_1$ and $TB_2$ respectively. The amplifier circuit 622 can amplify the phase shifted signals $PS_1$ and $PS_2$ to generate the RF output signal $R_{OUTB}$. In the present embodiment, the amplifier circuit 622 may include two amplifiers 641 and 642, and a signal combiner 626. Each of the amplifiers 641 and 642 can be implemented using a VGA. The amplifier 641 is arranged to amplify the phase shifted signal $PS_1$ to generate an amplified signal $SG_1$. The amplifier 642 is arranged to amplify the phase shifted signal $PS_2$ to generate an amplified signal $SG_2$. The signal combiner 626 is configured to combine the amplified signals $SG_1$ and $SG_2$ to generate the RF output signal $RF_{OUTB}$.

The phase shifting circuit 630 includes a plurality of phase shifting stages 632 and 634. The phase shifting stage 632 is configured to phase shift at least one of the electrical signals $EO_V$ and $EO_H$ to produce a combined signal $CS_B$ at an output terminal TC. By way of example but not limitation, the phase shifting stage 632 may be implemented using two transmission lines of different lengths. One transmission line is arranged for transmitting the electrical signal $EO_V$ to produce an electrical signal. The other transmission line is arranged for transmitting the electrical signal $EO_H$ to produce another electrical signal. The produced electrical signals can be combined, superimposed or added in phase at the output terminal TC to produce the combined signal $CS_B$.

The phase shifting stage 634 is configured to phase shift the combined signal $CS_B$ to generate the phase shifted signals $PS_1$ and $PS_2$. By way of example but not limitation, the phase shifting stage 634 may include a phase shifter 636, which is disposed between the output terminal TC and the input terminal $TB_2$. The combined signal CS may be split into two input signals. One input signal is coupled from the output terminal TC to the input terminal $TB_2$ to produce the phase shifted signal $PS_1$. The phase shifter 636 can phase shift other input signal by 90° to produce the phase shifted signal $PS_2$.

In some embodiments, a phase shifter can be provided between the output terminal TC and the input terminal $TB_1$ as long as phase shifted signals $PS_1$ and $PS_2$ can have a phase difference of 90°. For example, the phase shifter located between the output terminal TC and the input terminal $TB_1$ may provide a first phase shift amount, and the phase shifter 636 may provide a second phase shift amount. The sum of the first and second phase shift amounts may be equal to or substantially equal to 90°.

FIG. 7 illustrates an implementation of the RF receiver 604 shown in FIG. 6 in accordance with some embodiments of the present disclosure. The RF receiver 704 includes the chip 620 shown in FIG. 6, a radiating element 710 and a phase shifting circuit 730. The radiating element 710 is implemented using a dual-feed patch antenna, and can serve as an embodiment of the radiating element 610 shown in FIG. 6. The phase shifting circuit 730 may include a plurality of transmission lines 731 and 732, and a branch-line coupler 734. The transmission lines 731 and 732 can serve as an embodiment of the phase shifting stage 632 shown in FIG. 6. The branch-line coupler 734 can serve as an embodiment of the phase shifting stage 634 shown in FIG. 6. Note that the transmission line 731, the transmission line 732 and the branch-line coupler 734 can be implemented using, but are not limited to, microstrip lines. In some cases where the radiating element 710 is implemented using a microstrip antenna, the transmission lines 731 and 732, the branch-line coupler 734, and the radiating element 710 can be simultaneously formed on a passive substrate outside the chip 620.

The transmission line 731 is arranged to couple the electrical signal $EO_V$ to the output terminal TC, and accordingly output an electrical signal $EE_V$. The transmission line 732 is arranged to couple the electrical signal $EO_H$ to the output terminal TC, and accordingly output an electrical signal $EE_H$. The electrical signals $EE_V$ and $EE_H$ are combined, superimposed or added at the output terminal TC to produce the combined signal $CS_B$. In the present embodiment, the length of the transmission line 732 is greater than the length of the transmission line 731. For example, the length difference between the transmission lines 731 and 732 may be equal to a quarter wavelength or an odd multiple of the quarter wavelength. The electrical signals $EE_V$ and $EE_H$ can be added in phase.

The branch-line coupler 734 includes two input terminals $TI_{B1}$ and $TI_{B2}$, and two output terminals $TO_{B1}$ and $TO_{B2}$. The input terminal $TI_{B1}$ is arranged to receive the combined signal $CS_B$. The input terminal $TI_{B2}$ is isolated. For example, the input terminal $TI_{B2}$ is coupled to an isolation resistor $R_I$. The output terminal $TO_{B1}$ is arranged to output the phase shifted signal $PS_1$, and the output terminal $TO_{B2}$ is arranged to output the phase shifted signal $PS_2$.

In operation, the radiating element 710 can receive an RHCP or LHCP wave to output the electrical signals $EO_V$ and $EO_H$, which are of equal amplitude and have a phase difference of 90°. The transmission line 731 can couple the electrical signal $EO_V$ to the output terminal TC, and the transmission line 732 can couple the electrical signal $EO_H$ to the output terminal TC. The branch-line coupler 734 can couple the combined signal $CS_B$ at the output terminal TC to the input terminals $TB_1$ and $TB_2$. The amplifier circuit 622 can amplify the phase shifted signals $PS_1$ and $PS_2$ at the input terminals $TB_1$ and $TB_2$ to thereby generate the RF output signal $R_{OUTB}$.

Note that the phase shifting circuit 730, e.g. two phase shifters, can be designed in conjunction with the radiating element 710 rather than active devices of the chip 620. In other words, the transmission lines 731 and 732, the branch-line coupler 734, and the radiating element 710 can be formed or layouted on a passive substrate. The chip area would be reserved for active devices (e.g. active amplifiers which occupy a relatively small area) rather than a phase shifter. Thus, the proposed technique for heterogeneous integration of active and passive devices on a phased array receiver can reduce not only the chip size and manufacturing costs, but also signal attenuation and power consumption.

The structures shown in FIG. 6 and FIG. 7 are provided for illustrative purposes only, and are not intended to limit the scope of the present disclosure. In some embodiments, the phase shifting stage 632 shown in FIG. 6 may be implemented using a branch-line coupler, such as the branch-line coupler 734 shown in FIG. 7. In some embodiments, the phase shifting stage 634 shown in FIG. 6 may be implemented using transmission lines of different lengths, such as the transmission lines 731 and 732 shown in FIG. 7.

In some embodiments, the amplifier circuit 622 shown in FIG. 6 may include other circuit elements. Referring to FIG. 8, the RF receiver 804 can represent another embodiment of the RF receiver 204B shown in FIG. 2B. The structure of the RF receiver 804 is similar/identical to the structure of the RF receiver 604 shown in FIG. 6 except for the chip 820. In the present embodiment, the amplifier circuit 822 in the chip 820 includes the signal combiner 626 shown in FIG. 6, amplifier paths 841 and 842, and a buffer 801.

The amplifier path 841 is configured to amplify the phase shifted signal $PS_1$ to generate the amplified signal $SG_1$. The amplifier path 842 is configured to amplify the phase shifted signal $PS_2$ to generate the amplified signal $SG_2$. In the present embodiment, the amplifier path 841 includes the amplifier 641 shown in FIG. 6 and an amplifier 811. The amplifier path 842 includes the amplifier 642 shown in FIG. 6 and an amplifier 812. Each of the amplifiers 811 and 812 can be implemented using an LNA. The signal combiner 626 can combine the amplified signals $SG_1$ and $SG_2$ to generate a combined signal $BS_B$. The buffer 801 can buffer the combined signal $BS_B$ to generate the RF output signal $RF_{OUTB}$, i.e. a buffered version of the combined signal $BS_B$. As those skilled in the art can appreciate the operation of the RF receiver 804 shown in FIG. 8 after reading the above paragraphs directed to FIG. 1 to FIG. 7, further description is omitted here for brevity.

FIG. 9 to FIG. 12 illustrate implementations of the RF transmitter 204A shown in FIG. 2A in accordance with some embodiments of the present disclosure. FIG. 13 to FIG. 16 illustrate implementations of the RF receiver 204B shown in FIG. 2B in accordance with some embodiments of the present disclosure. In the embodiments shown in FIG. 9 to FIG. 16, a radiating element included in the RF transmitter/receiver is implemented using an antenna element with two feeding points. In addition, the direction of rotation of a circularly polarized wave that the RF transmitter/receiver can emit/receive is selectable.

Figure 9:
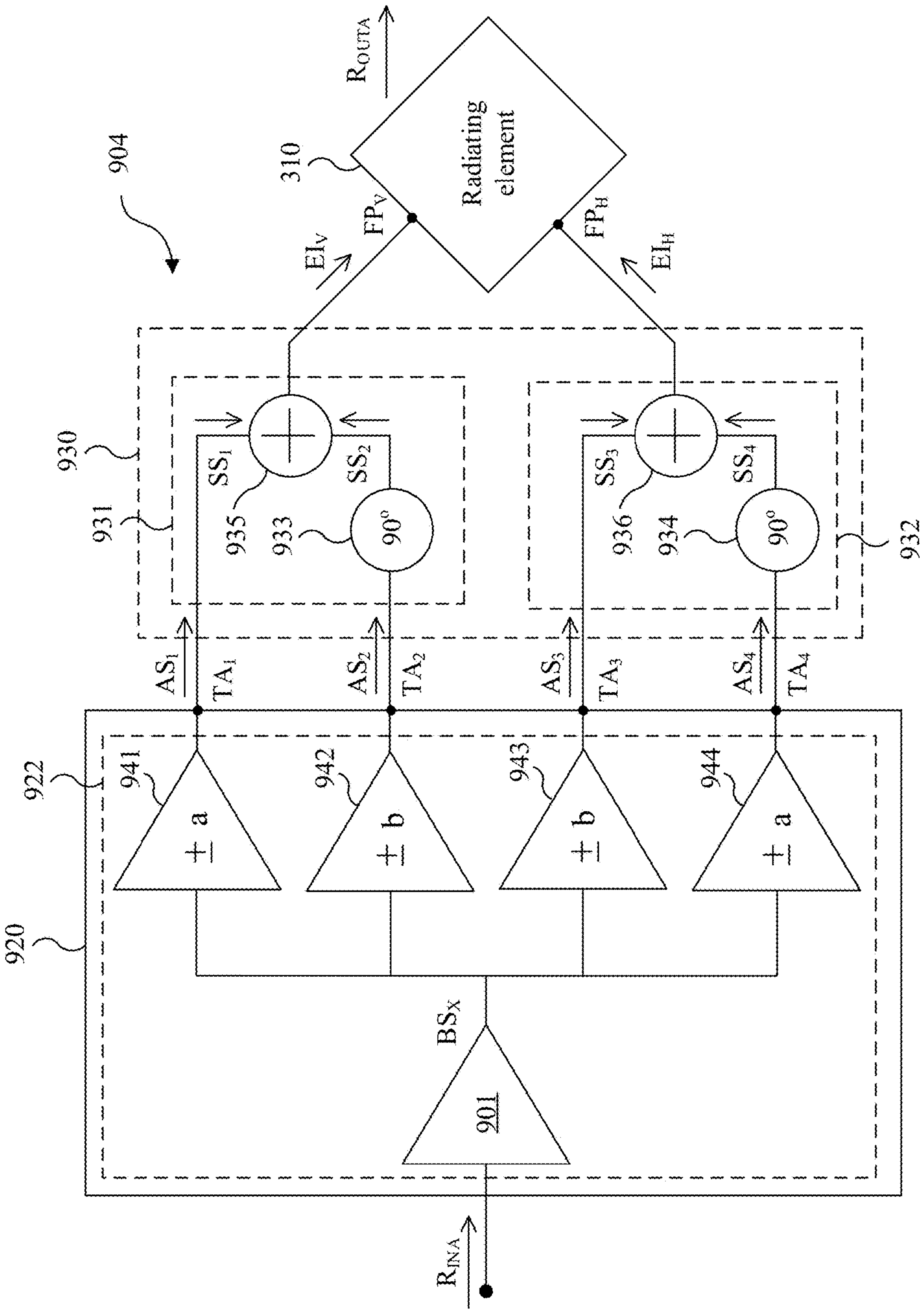
FIG. 9 to FIG. 12 illustrate implementations of the RF transmitter shown in FIG. 2A in accordance with some embodiments of the present disclosure.

Referring firstly to FIG. 9, the RF transmitter 904 can represent an embodiment of the RF transmitter 204A shown in FIG. 2A. The RF transmitter 904 includes the radiating element 310 shown in FIG. 3, a chip 920 and a phase shifting circuit 930. The chip 920 and the phase shifting circuit 930 can represent embodiments of the chip 220A and the phase shifting circuit 230A shown in FIG. 2A, respectively. In the example of FIG. 9, the electrical signals $EI_V$ and $EI_H$ may be of equal amplitude, and have a phase difference of 90°. The radiating element 310 can receive the electrical signals $EI_V$ and $EI_H$ to produce a circularly polarized electromagnetic wave, i.e. the RF output signal $R_{OUTA}$.

The chip 920 includes an amplifier circuit 922, which is configured to amplify the RF input signal $R_{INA}$ to generate four amplified signals $AS_1$-$AS_4$. By way of example but not limitation, the amplifier circuit 922 may include a buffer 901 and four amplifiers paths. The buffer 901 is configured to buffer the RF input signal $R_{INA}$ to generate a buffered signal $BS_X$, i.e. a buffered version of the RF input signal $R_{INA}$. The four amplifier paths are implemented using four amplifiers 941-944, respectively. Each of the amplifiers 941-944 can be implemented using a VGA. The buffered signal $BS_X$ can be split into four input signals that are in phase. By amplifying a corresponding input signal split from the buffered signal $BS_X$, each amplifier can amplify the RF input signal $R_{INA}$ and accordingly generate a corresponding amplified signal.

The phase shifting circuit 930 includes a plurality of phase shifting stages 931 and 932. The phase shifting stage 931 is coupled to the output terminals $TA_1$ and $TA_2$ of the chip 920 to receive the amplified signals $AS_1$ and $AS_2$. The phase shifting stage 931 is configured to phase shift at least one of the amplified signals $AS_1$ and $AS_2$ to produce phase shifted signals $SS_1$ and $SS_2$ having a phase difference of 90°. The phase shifting stage 931 may combine the phase shifted signals $SS_1$ and $SS_2$ to generate the electrical signal $EI_V$. In the present embodiment, the phase shifting stage 931 can be implemented using the phase shifting stage 332 shown in FIG. 3. For example, the phase shifting stage 931 may include a phase shifter 933 and a signal combiner 935, which can be implemented using the phase shifter 334 and the signal combiner 336 shown in FIG. 3, respectively.

The phase shifting stage 932 is coupled to the output terminals $TA_3$ and $TA_4$ of the chip 920 to receive the amplified signals $AS_3$ and $AS_4$. The phase shifting stage 932 is configured to phase shift at least one of the amplified signals $AS_3$ and $AS_4$ to produce phase shifted signals $SS_3$ and $SS_4$ having a phase difference of 90°. The phase shifting stage 932 may combine the phase shifted signals $SS_3$ and $SS_4$ to generate the electrical signal $EI_H$. Similarly, the phase shifting stage 932 can be implemented using the phase shifter stage 332 shown in FIG. 3. For example, the phase shifting stage 932 may include a phase shifter 934 and a signal combiner 936, which can be implemented using the phase shifter 334 and the signal combiner 336 shown in FIG. 3, respectively.

Figure 10:
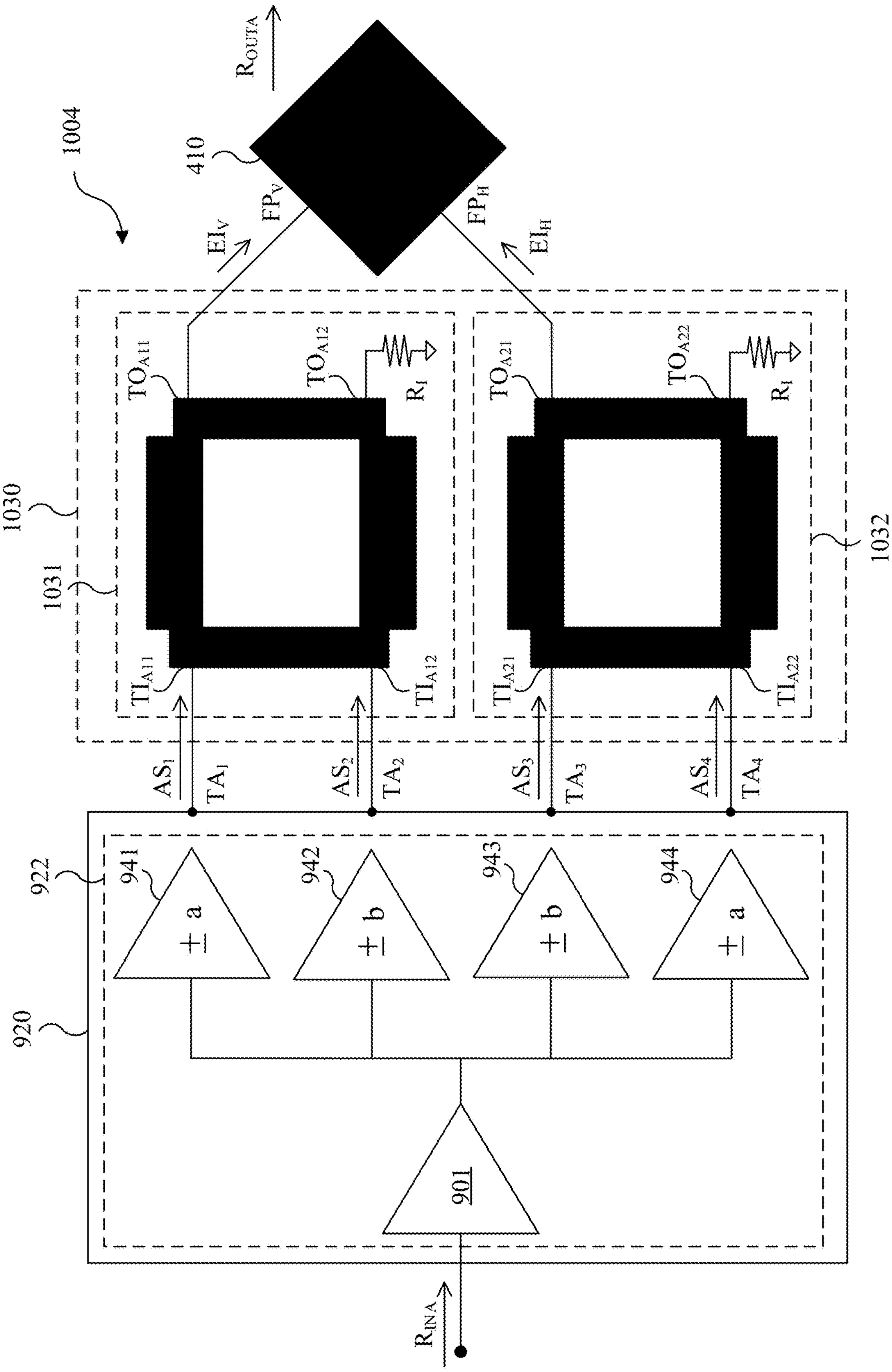

FIG. 10 illustrates an implementation of the RF transmitter 904 shown in FIG. 9 in accordance with some embodiments of the present disclosure. The RF transmitter 1004 may include the radiating element 410 shown in FIG. 4, the chip 920 shown in FIG. 9, and a phase shifting circuit 1030. The phase shifting circuit 1030 may include branch-line couplers 1031 and 1032, which can serve as embodiments of the phase shifting stages 931 and 932 shown in FIG. 9 respectively. Note that the branch-line couplers 1031 and 1032 can be implemented using, but are not limited to, microstrip lines. In some cases where the radiating element 410 is implemented using a microstrip antenna, the branch-line couplers 1031 and 1032, and the radiating element 410 can be simultaneously formed on a passive substrate outside the chip 920.

In the present embodiment, each of the branch-line couplers 1031 and 1032 can be implemented using the branch-line coupler 432 shown in FIG. 4. The branch-line coupler 1031 includes two input terminals $TI_{A11}$ and $TI_{A12}$, and two output terminals $TO_{A11}$ and $TO_{A12}$. The input terminals $TI_{A11}$ and $TI_{A12}$ are arranged to receive the amplified signals $AS_1$ and $AS_2$ respectively. The output terminal $TO_{A11}$ is arranged to output the electrical signal $EI_V$, and the output terminal $TO_{A12}$ is isolated. For example, the output terminal $TO_{A12}$ is coupled to an isolation resistor $R_I$. Similarly, the branch-line coupler 1032 includes two input terminals $TI_{A21}$ and $TI_{A22}$, and two output terminals $TO_{A21}$ and $TO_{A22}$. The input terminals $TI_{A21}$ and $TI_{A22}$ are arranged to receive the amplified signals $AS_3$ and $AS_4$ respectively. The output terminal $TO_{A21}$ is arranged to output the electrical signal $EI_H$, and the output terminal $TO_{A22}$ is isolated. For example, the output terminal $TO_{A22}$ is coupled to an isolation resistor $R_I$.

In operation, the branch-line coupler 1031 can couple the amplified signals $AS_1$ and $AS_2$ to the feeding point $FP_V$ to thereby produce the electrical signal $EI_V$. The branch-line coupler 1031 can act as a 90° phase shifter in combination with a signal combiner. The branch-line coupler 1032 can couple the amplified signals $AS_3$ and $AS_4$ to the feeding point $FP_H$ to thereby produce the electrical signal $EI_H$. The branch-line coupler 1032 can act as a 90° phase shifter in combination with a signal combiner. The radiating element 410 can produce an RHCP or LHCP wave according to the electrical signals $EI_V$ and $EI_H$.

Note that the phase shifting circuit 1030, e.g. two phase shifters, can be designed in conjunction with the radiating element 410 rather than active devices of the chip 920. In other words, the branch-line coupler 1031 and 1032, and the radiating element 410 can be formed or layouted on a passive substrate. The chip area would be reserved for active devices rather than a phase shifter, which thereby reduces the chip size and manufacturing costs. In addition, the structures shown in FIG. 9 and FIG. 10 are provided for illustrative purposes only, and are not intended to limit the scope of the present disclosure. In some embodiments, the phase shifting stage 931/932 shown in FIG. 9 may be implemented using transmission lines of different lengths.

The RF transmitters shown in FIG. 9 and FIG. 10 can adjust the direction of rotation of an emitted circularly polarized wave according to respective gain values of the amplifier paths. Referring again to FIG. 9, respective gain values of the amplifiers 941-944 are adjustable. By way of example but not limitation, the amplifier 941 is arranged to amplify the RF input signal $R_{INA}$ with a gain value, selected from a group including +a and −a (a is a real number), to generate the amplified signal $AS_1$. The amplifier 942 is arranged to amplify the RF input signal $R_{INA}$ with a gain value, selected from a group including +b and −b (b is a real number), to generate the amplified signal $AS_2$. The amplifier 943 is arranged to amplify the RF input signal $R_{INA}$ with a gain value, selected from a group including +b and −b, to generate the amplified signal $AS_3$. The amplifier 944 is arranged to amplify the RF input signal $R_{INA}$ with a gain value, selected from a group including +a and −a, to generate the amplified signal $AS_4$.

In some embodiments, when the gain value of the amplifier 941 is opposite of the gain value of the amplifier 944, and the gain value of the amplifier 942 is equal to the gain value of the amplifier 943, the RF output signal $R_{OUTA}$ outputted from the radiating element 310 is circularly polarized in one direction. In some embodiments, when the gain value of the amplifier 941 is equal to the gain value of the amplifier 944, and the gain value of the amplifier 942 is opposite of the gain value of the amplifier 943, the RF output signal $R_{OUTA}$ outputted from the radiating element 310 is circularly polarized in another direction.

Figure 11A:
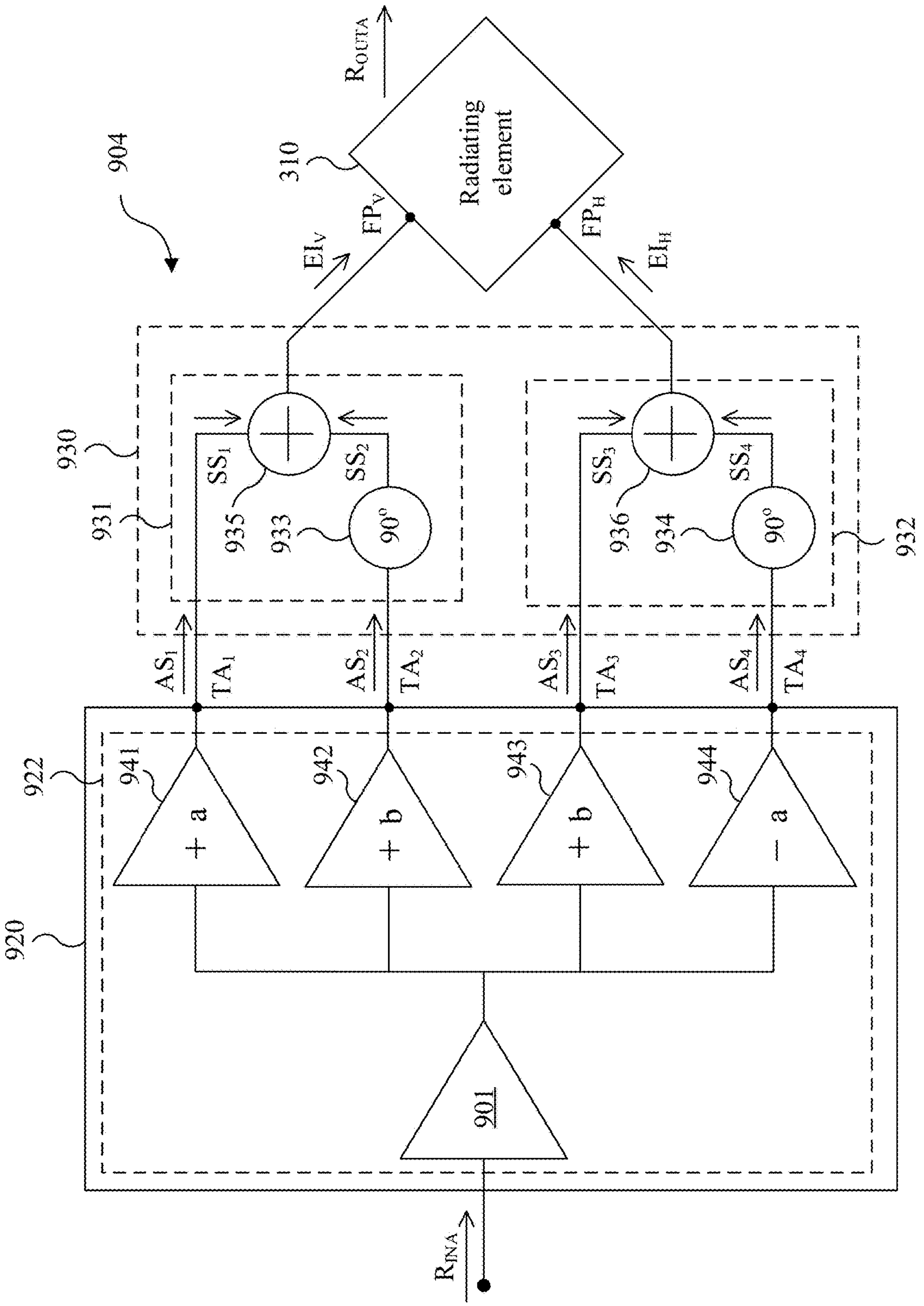

FIG. 11A is a diagram illustrating an exemplary gain configuration of the amplifier circuit 922 shown in FIG. 9. In the present embodiment, the RF transmitter 904 can emit an LHCP wave according to the gain configuration of the amplifier circuit 922. In other words, the RF output signal $R_{OUTA}$ can rotate in a left-handed sense or a counter-clockwise direction. For illustrative purposes, the RF input signal $R_{INA}$ may be a cosine wave represented as $\cos(\omega t)$, where $\omega$ is an angular frequency and t is time. To emit an LHCP wave, the radiating element 310 may receive the electrical signal $EI_H$ represented as $+b\cdot\cos(\omega t)-a\cdot\sin(\omega t)$, and receive the electrical signal $EI_V$ represented as +a·cos(ωt)+b·sin(ωt). Thus, when the gain values of the amplifiers 941-944 are set to +a, +b, +b and −a, respectively, the radiating element 310 can emit an LHCP wave.

Figure 11B:
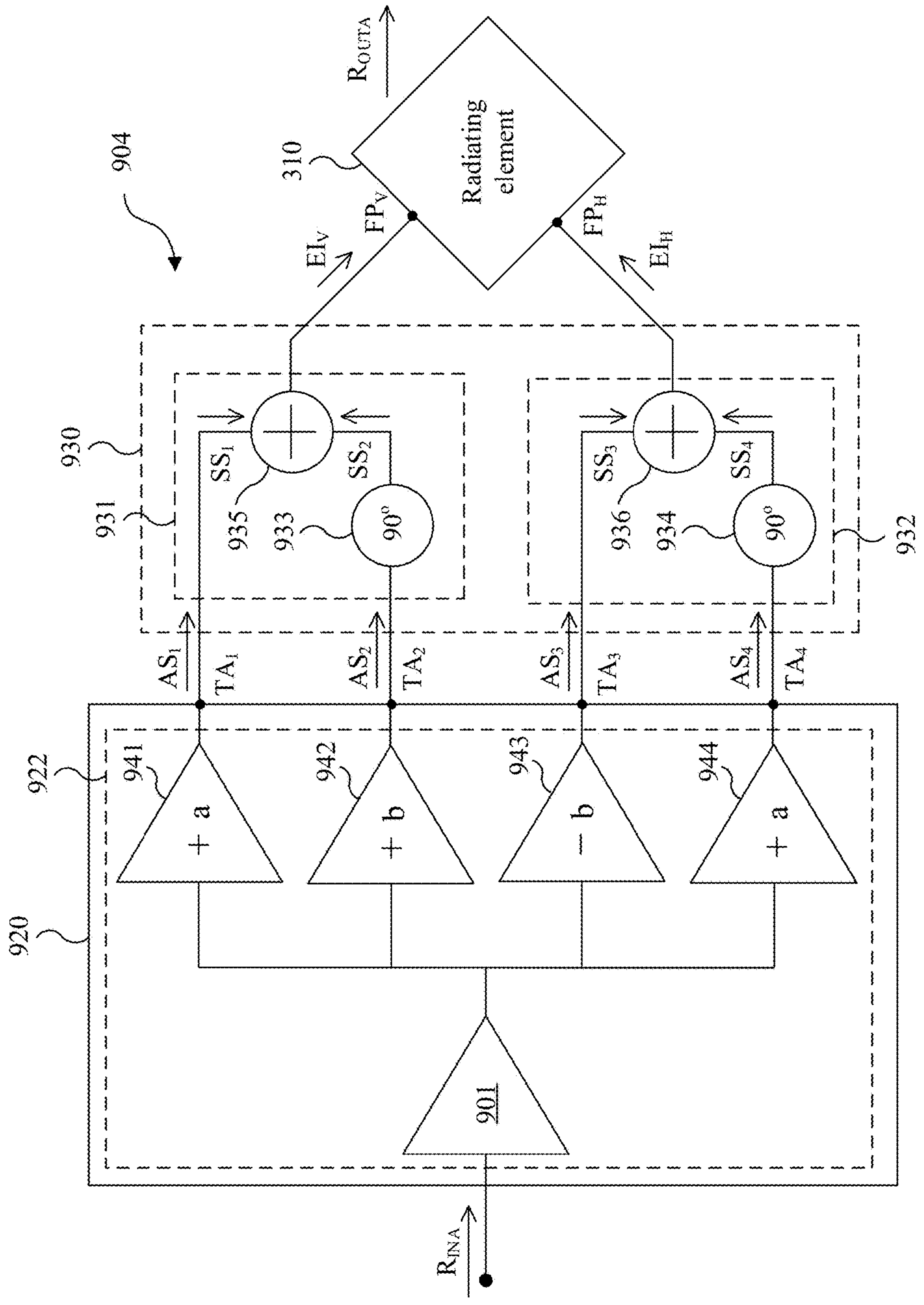

FIG. 11B is a diagram illustrating an exemplary gain configuration of the amplifier circuit 922 shown in FIG. 9. In the present embodiment, the RF transmitter 904 can emit an RHCP wave according to the gain configuration of the amplifier circuit 922. In other words, the RF output signal $R_{OUTA}$ can rotate in a right-handed sense or a clockwise direction. For illustrative purposes, the RF input signal $R_{INA}$ may be a cosine wave represented as cos(ωt), where ω is an angular frequency and t is time. To emit an RHCP wave, the radiating element 310 may receive the electrical signal $EI_H$ represented as −b·cos(ωt)+a·sin(ωt), and receive the electrical signal $EI_V$ represented as +a·cos(ωt)+b·sin(ωt). Thus, when the gain values of the amplifiers 941-944 are set to +a, +b, −b and −a, respectively, the radiating element 310 can emit an RHCP wave.

Figure 12:
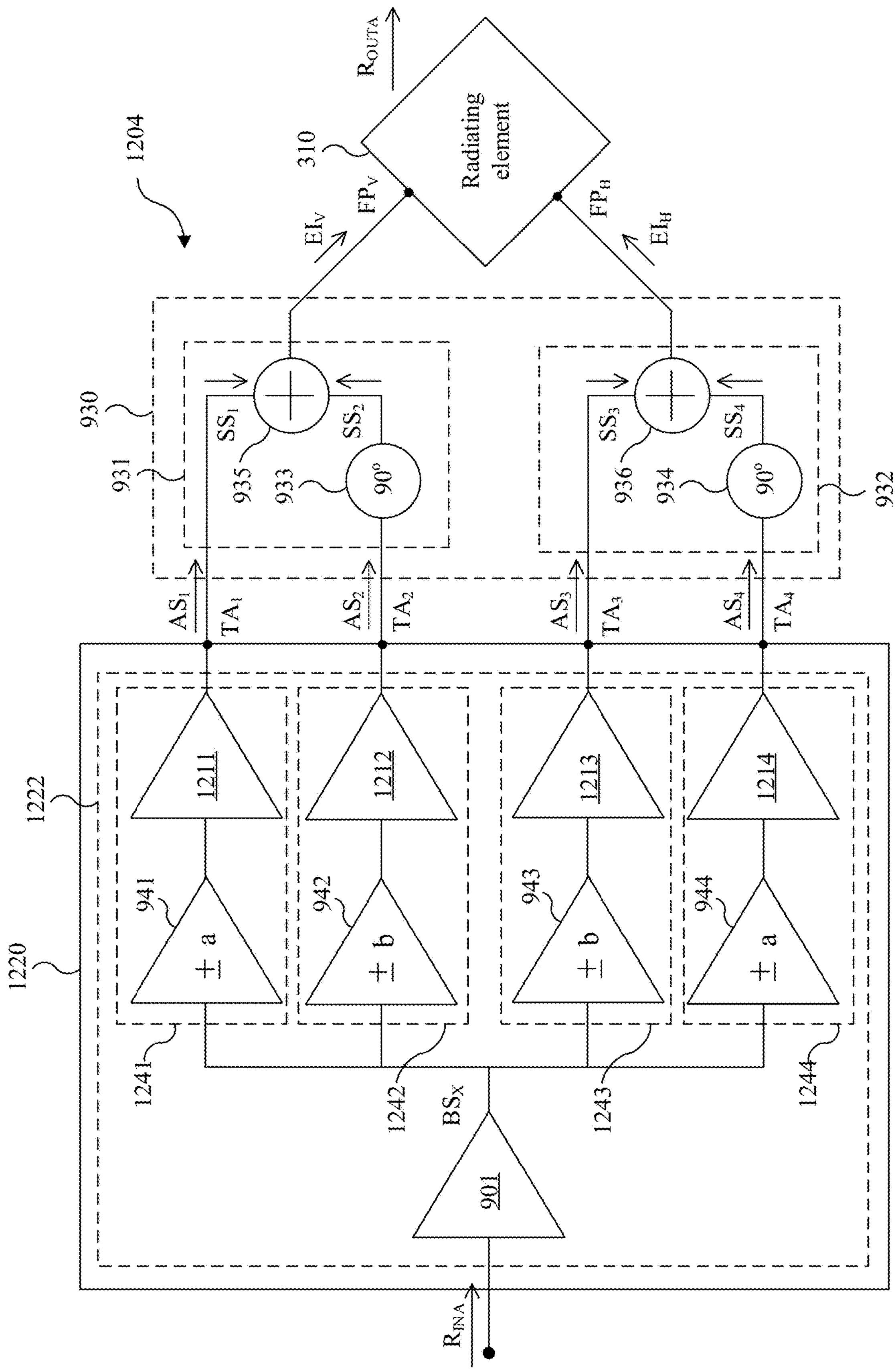

In some embodiments, the amplifier circuit 922 shown in FIG. 9 may include other circuit elements. Referring to FIG. 12, the RF transmitter 1204 can represent another embodiment of the RF transmitter 204A shown in FIG. 2A. The structure of the RF transmitter 1204 is similar/identical to the structure of the RF transmitter 904 shown in FIG. 9 except for the chip 1220. In the present embodiment, the amplifier circuit 1222 in the chip 1220 includes the buffer 901 shown in FIG. 9 and amplifier paths 1241-1244.

The amplifier path 1241 is configured to amplify the buffered signal $BS_X$ to generate the amplified signal $AS_1$. The amplifier path 1242 is configured to amplify the buffered signal $BS_X$ to generate the amplified signal $AS_2$. The amplifier path 1243 is configured to amplify the buffered signal $BS_X$ to generate the amplified signal $AS_3$. The amplifier path 1244 is configured to amplify the buffered signal $BS_X$ to generate the amplified signal $AS_4$. In the present embodiment, the amplifier path 1241 includes the amplifier 941 shown in FIG. 9 and an amplifier 1211. The amplifier path 1242 includes the amplifier 942 shown in FIG. 9 and an amplifier 1212. The amplifier path 1243 includes the amplifier 943 shown in FIG. 9 and an amplifier 1213. The amplifier path 1244 includes the amplifier 944 shown in FIG. 9 and an amplifier 1214. Each of the amplifiers 1211-1214 can be implemented using a PA. As those skilled in the art can appreciate the operation of the RF transmitter 1204 shown in FIG. 12 after reading the above paragraphs directed to FIG. 1 to FIG. 11B, further description is omitted here for brevity.

Figure 13:
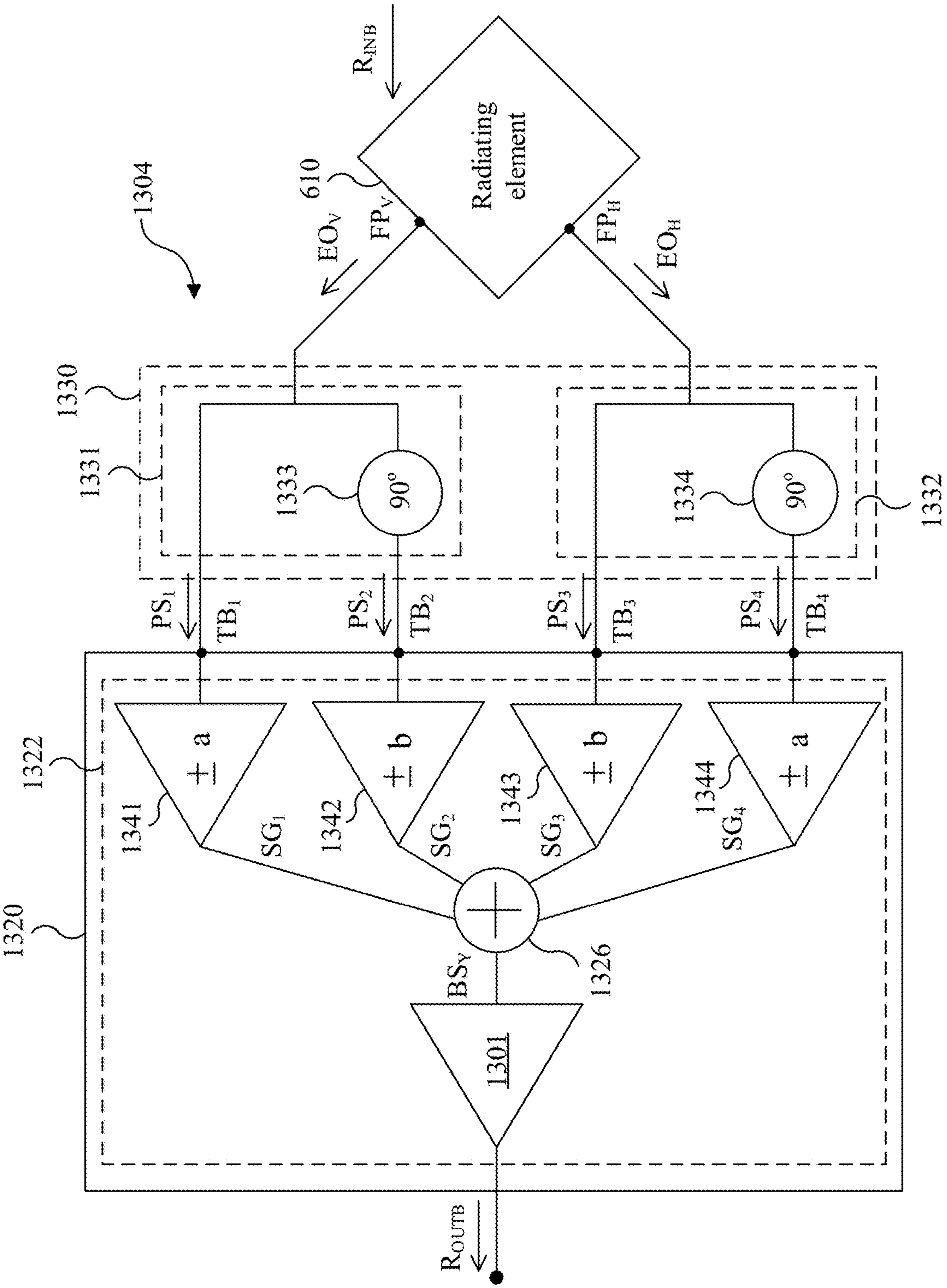
FIG. 13 to FIG. 16 illustrate implementations of the RF receiver shown in FIG. 2B in accordance with some embodiments of the present disclosure.

FIG. 13 is a diagram illustrating an implementation of the RF receiver 204B shown in FIG. 2B in accordance with some embodiments of the present disclosure. The RF receiver 1304 includes the radiating element 610 shown in FIG. 6, a chip 1320 and a phase shifting circuit 1330. The chip 1320 and the phase shifting circuit 1330 can represent embodiments of the chip 220B and the phase shifting circuit 230B shown in FIG. 2B respectively. In the example of FIG. 13, the electrical signals $EO_V$ and $EO_H$ may be of equal amplitude, and have a phase difference of 90°.

The chip 1320 includes an amplifier circuit 1322, which is configured to receive four phase shifted signals $PS_1$-$PS_4$ from four input terminals $TB_1$-$TB_4$ respectively. The amplifier circuit 1322 can amplify the phase shifted signals $PS_1$-$PS_4$ to generate the RF output signal $R_{OUTB}$. In the present embodiment, the amplifier circuit 1322 may include four amplifier paths, a signal combiner 1326 and a buffer 1301. The four amplifier paths are implemented using four amplifiers 1341-1344, respectively. Each amplifier can be implemented using a VGA.

The amplifier 1341 is arranged to amplify the phase shifted signal $PS_1$ to generate an amplified signal $SG_1$. The amplifier 1342 is arranged to amplify the phase shifted signal $PS_2$ to generate an amplified signal $SG_2$. The amplifier 1343 is arranged to amplify the phase shifted signal $PS_3$ to generate an amplified signal $SG_3$. The amplifier 1344 is arranged to amplify the phase shifted signal $PS_4$ to generate an amplified signal $SG_4$. The signal combiner 1326 is configured to combine the amplified signals $SG_1$-$SG_4$ to generate a combined signal $BS_Y$. The buffer 1301 can buffer the combined signal $BS_Y$ to generate the RF output signal $RF_{OUTB}$, i.e. a buffered version of the combined signal $BS_Y$.

The phase shifting circuit 1330 includes a plurality of phase shifting stages 1331 and 1332. The phase shifting stage 1331 is configured to phase shift the electrical signal $EO_V$ to generate the phase shifted signals $PS_1$ and $PS_2$. The phase shifting stage 1332 is configured to phase shift the electrical signal $EO_H$ to generate the phase shifted signals $PS_3$ and $PS_4$. In the present embodiment, each of the phase shifting stages 1331 and 1332 can be implemented using the phase shifting stage 634 shown in FIG. 6. For example, the phase shifting stage 1331 may include a phase shifter 1333, which can be implemented using the phase shifter 636 shown in FIG. 6. The phase shifting stage 1332 may include a phase shifter 1334, which can be implemented using the phase shifter 636 shown in FIG. 6.

Figure 14:
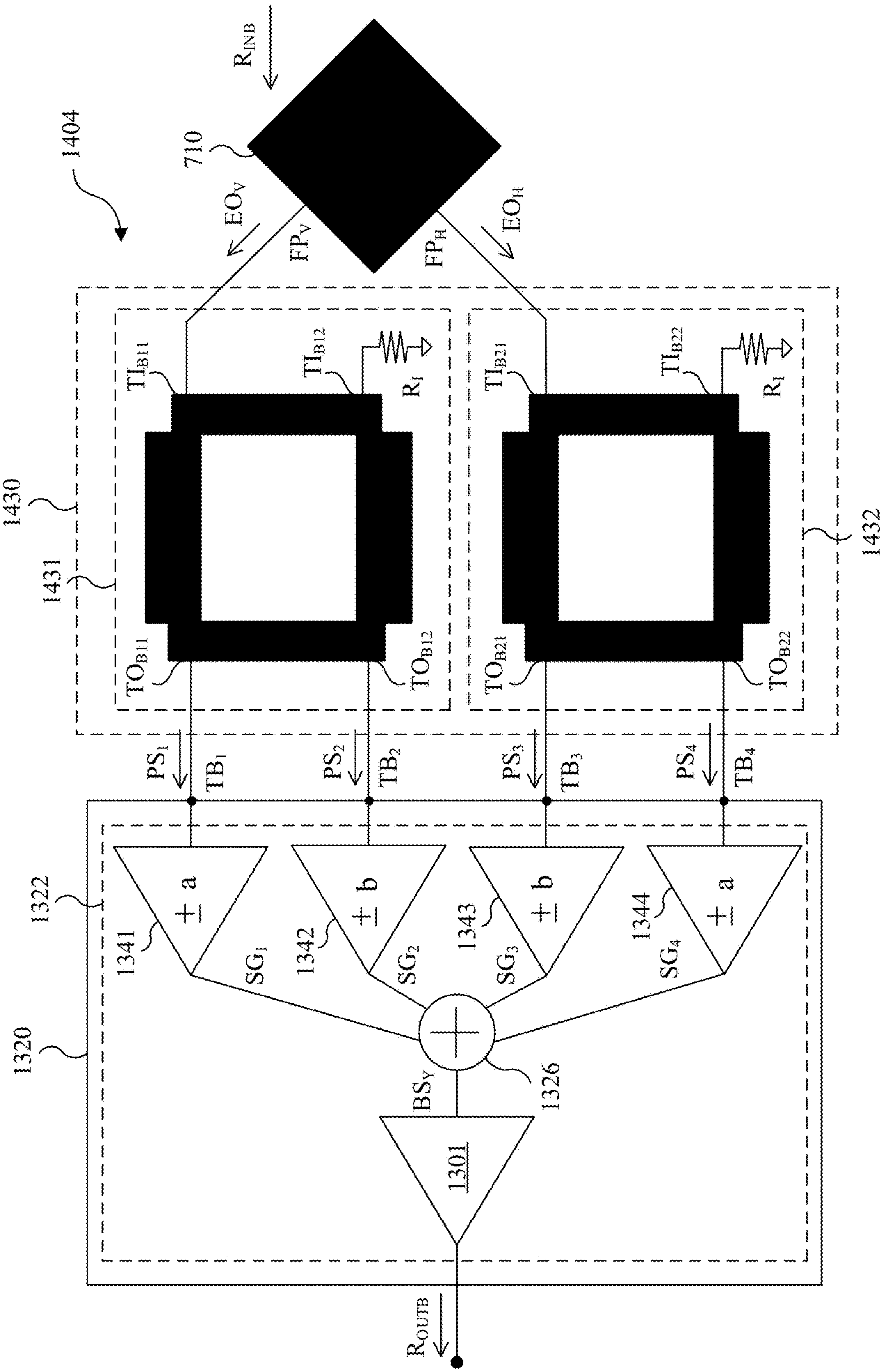

FIG. 14 illustrates an implementation of the RF receiver 1304 shown in FIG. 13 in accordance with some embodiments of the present disclosure. The RF receiver 1404 includes the radiating element 710 shown in FIG. 7, the chip 1320 shown in FIG. 13, and a phase shifting circuit 1430. The phase shifting circuit 1430 may include a plurality of branch-line couplers 1431 and 1432, which can serve as embodiments of the phase shifting stages 1331 and 1332 shown in FIG. 13 respectively. Note that the branch-line couplers 1431 and 1432 can be implemented using, but are not limited to, microstrip lines. In some cases where the radiating element 710 is implemented using a microstrip antenna, the branch-line couplers 1431 and 1432, and the radiating element 710 can be simultaneously formed on a passive substrate outside the chip 1320.

In the present embodiment, each of the branch-line couplers 1431 and 1432 can be implemented using the branch-line coupler 734 shown in FIG. 7. The branch-line coupler 1431 includes two input terminals $TI_{B11}$ and $TI_{B12}$, and two output terminals $TO_{B11}$ and $TO_{B12}$. The input terminal $TI_{B11}$ is arranged to receive the electrical signal $EI_V$. The input terminal $TI_{B12}$ is isolated. For example, the input terminal $TI_{B12}$ is coupled to an isolation resistor $R_I$. The output terminal $TO_{B11}$ is arranged to output the phase shifted signal $PS_1$, and the output terminal $TO_{B12}$ is arranged to output the phase shifted signal $PS_2$. Similarly, the branch-line coupler 1432 includes two input terminals $TI_{B21}$ and $TI_{B22}$, and two output terminals $TO_{B21}$ and $TO_{B22}$. The input terminal $TI_{B21}$ is arranged to receive the electrical signal $EI_H$. The input terminal $TI_{B22}$ is isolated. For example, the input terminal $TI_{B22}$ is coupled to an isolation resistor $R_I$. The output terminal $TO_{B21}$ is arranged to output the phase shifted signal $PS_3$, and the output terminal $TO_{B22}$ is arranged to output the phase shifted signal $PS_4$.

In operation, the radiating element 710 can receive an RHCP or LHCP wave to output the electrical signals $EO_V$ and $EO_H$, which are of equal amplitude and have a phase difference of 90°. The branch-line coupler 1431 can couple the electrical signal $EO_V$ at the feeding point $FP_V$ to the input terminals $TB_1$ and $TB_2$. The branch-line coupler 1432 can couple the electrical signal $EO_H$ at the feeding point $FP_H$ to the input terminals $TB_3$ and $TB_4$. The amplifier circuit 1322 can amplify the phase shifted signals $PS_2$-$PS_4$ at the input terminals $TB_1$-$TB_4$ to thereby generate the RF output signal $R_{OUTB}$.

Note that the phase shifting circuit 1430, e.g. two 90° phase shifters, can be designed in conjunction with the radiating element 710 rather than active devices of the chip 1320. In other words, the branch-line coupler 1431 and 1432, and the radiating element 710 can be formed or layouted on a passive substrate. The chip area would be reserved for active devices rather than a phase shifter, which thereby reduces the chip size and manufacturing costs. In addition, the structures shown in FIG. 13 and FIG. 14 are provided for illustrative purposes only, and are not intended to limit the scope of the present disclosure. In some embodiments, the phase shifting stage 1331/1332 shown in FIG. 13 may be implemented using transmission lines of different lengths.

The RF receivers shown in FIG. 13 and FIG. 14 can adjust respective gain values of the amplifier paths to receive a circularly polarized wave rotating in a predetermined direction. Referring again to FIG. 13, respective gain values of the amplifiers 1341-1344 are adjustable. By way of example but not limitation, the amplifier 1341 is arranged to amplify the phase shifted signal $PS_1$ with a gain value, selected from a group including +a and −a, to generate the amplified signal $SG_1$. The amplifier 1342 is arranged to amplify the phase shifted signal $PS_2$ with a gain value, selected from a group including +b and −b, to generate the amplified signal $SG_2$. The amplifier 1343 is arranged to amplify the phase shifted signal $PS_3$ with a gain value, selected from a group including +b and −b, to generate the amplified signal $SG_3$. The amplifier 1344 is arranged to amplify the phase shifted signal $PS_4$ with a gain value, selected from a group including +a and −a, to generate the amplified signal $SG_4$. In some embodiments, when the gain value of the amplifier 1341 is opposite of the gain value of the amplifier 1344, and the gain value of the amplifier 1342 is equal to the gain value of the amplifier 1343, the radiating element 610 can receive the RF input signal $R_{INB}$ which is circularly polarized in one direction. In some embodiments, when the gain value of the amplifier 1341 is equal to the gain value of the amplifier 1344, and the gain value of the amplifier 1342 is equal to the gain value of the amplifier 1343, the radiating element 610 can receive the RF input signal $R_{INB}$ which is circularly polarized in another direction.

Figure 15A:
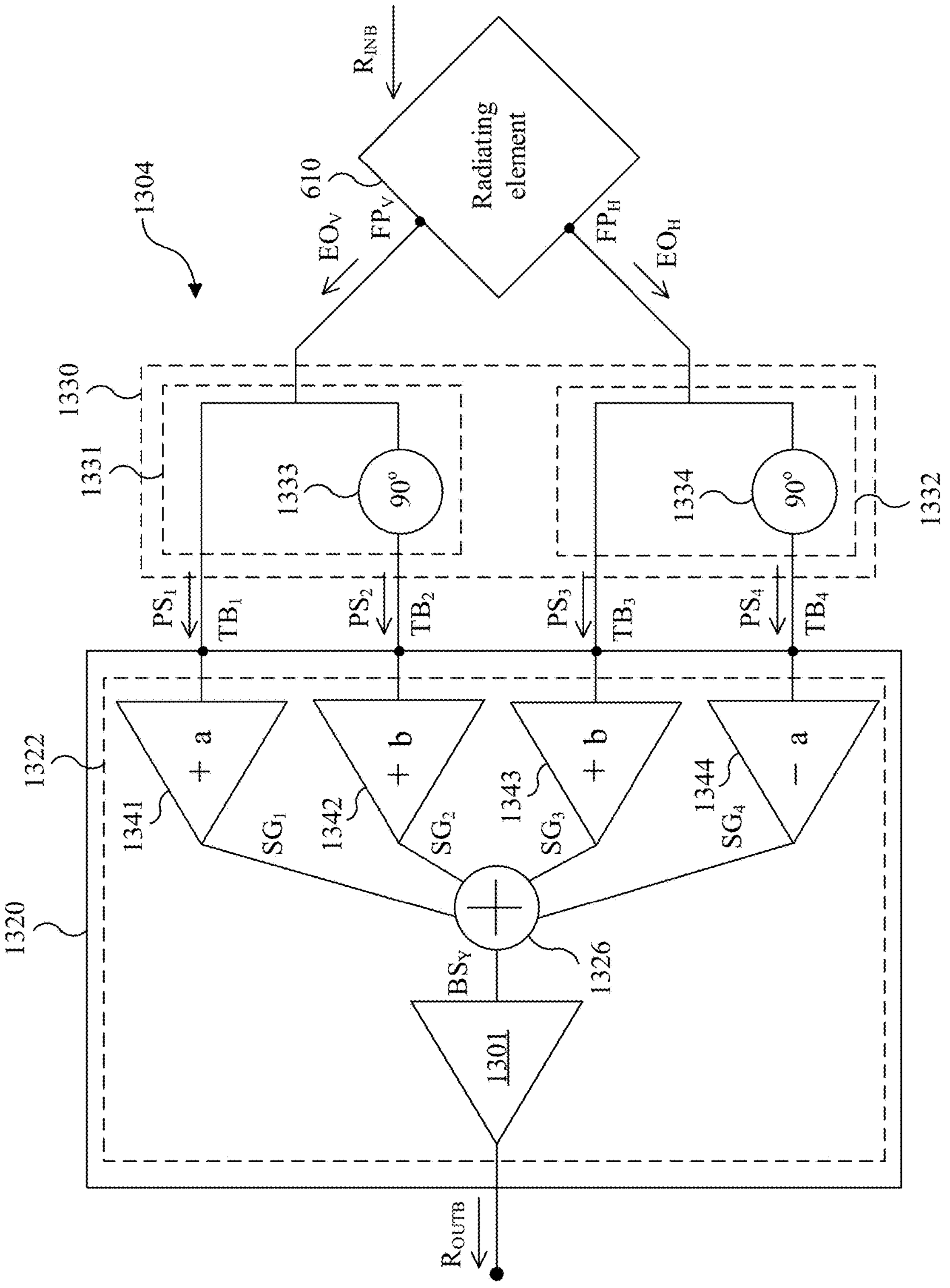

FIG. 15A is a diagram illustrating an exemplary gain configuration of the amplifier circuit 1322 shown in FIG. 13. In the present embodiment, the RF receiver 1304 is configured to receive an LHCP wave according to the gain configuration of the amplifier circuit 1322. When the radiating element 610 receives an LHCP wave, the electrical signal $EO_V$ will lag the electrical signal $EO_H$ by 90°. For illustrative purposes, the electrical signal $EO_H$ may be a sine wave represented as $\alpha\cdot\sin(\omega t)$, and the electrical signal $EO_V$ may be a cosine wave represented as $\alpha\cdot\cos(\omega t)$, where $\alpha$ is an amplitude, $\omega$ is an angular frequency and t is time. To preserve information carried by the electrical signals $EO_V$ and $EO_H$, the amplifier circuit 1322 may set the gain values of the amplifiers 1341-1344 to +a, +b, +b and −a, respectively, thereby outputting the RF output signal $R_{OUTB}$ represented as $2\alpha\cdot(a\cdot\cos(\omega t)+b\cdot\sin(\omega t))$.

Figure 15B:
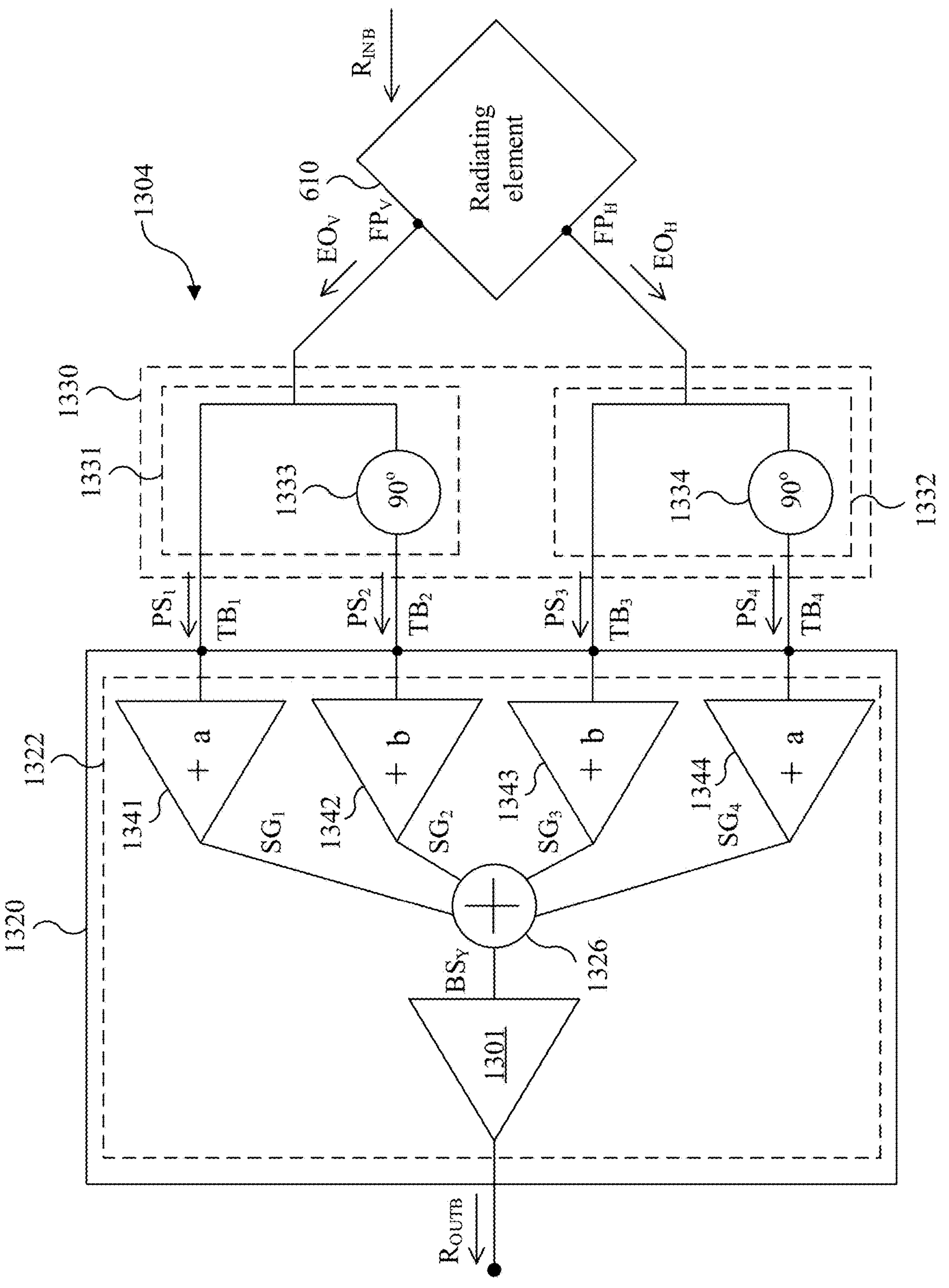

FIG. 15B is a diagram illustrating an exemplary gain configuration of the amplifier circuit 1322 shown in FIG. 13. In the present embodiment, the RF receiver 1304 is configured to receive an RHCP wave according to the gain configuration of the amplifier circuit 1322. When the radiating element 610 receives an RHCP wave, the electrical signal $EO_V$ will lead the electrical signal $EO_H$ by 90°. For illustrative purposes, the electrical signal $EO_H$ may be a cosine wave represented as $\alpha\cdot\cos(\omega t)$, and the electrical signal $EO_V$ may be a sine wave represented as $\alpha\cdot\sin(\omega t)$, where $\alpha$ is an amplitude, $\omega$ is an angular frequency and t is time. To preserve information carried by the electrical signals $EO_V$ and $EO_H$, the amplifier circuit 1322 may set the gain values of the amplifiers 1341-1344 to +a, +b, +b and +a, respectively, thereby outputting the RF output signal $R_{OUTB}$ represented as $2\alpha\cdot(b\cdot\cos(\omega t)+a\cdot\sin(\omega t))$.

Figure 16:
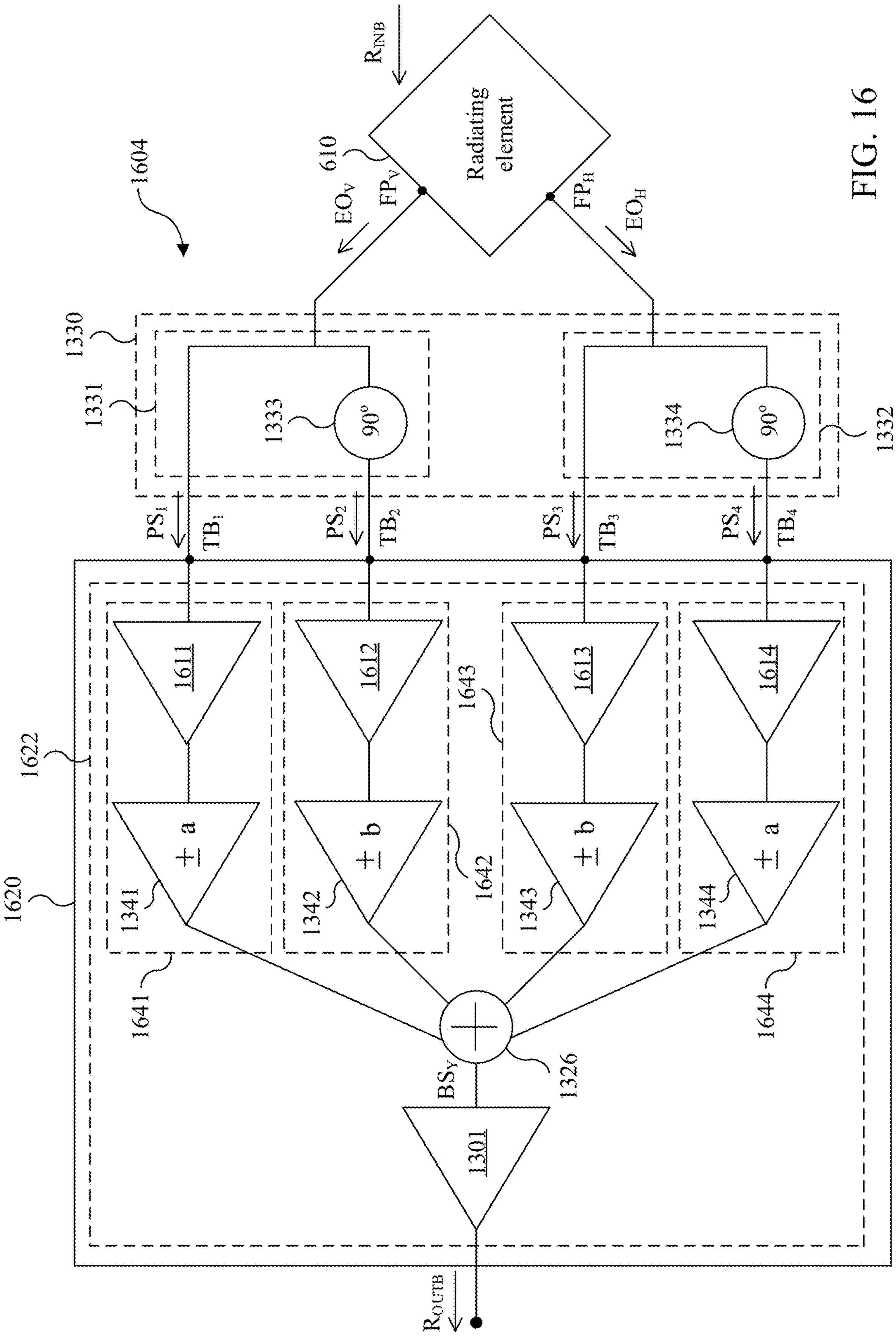

In some embodiments, the amplifier circuit 1322 shown in FIG. 13 may include other circuit elements. Referring to FIG. 16, the RF receiver 1604 can represent another embodiment of the RF receiver 204B shown in FIG. 2B. The structure of the RF receiver 1604 is similar/identical to the structure of the RF receiver 1304 shown in FIG. 13 except for the chip 1620. In the present embodiment, the amplifier circuit 1622 in the chip 1620 includes the signal combiner 1326 and the buffer 1301 shown in FIG. 13, and four amplifier paths 1641-1644.

The amplifier path 1641 is configured to amplify the phase shifted signal $PS_1$ to generate the amplified signal $SG_1$. The amplifier path 1642 is configured to amplify the phase shifted signal $PS_2$ to generate the amplified signal $SG_2$. The amplifier path 1643 is configured to amplify the phase shifted signal $PS_3$ to generate the amplified signal $SG_3$. The amplifier path 1644 is configured to amplify the phase shifted signal $PS_4$ to generate the amplified signal $SG_4$. In the present embodiment, the amplifier path 1641 includes the amplifier 1341 shown in FIG. 13 and an amplifier 1611. The amplifier path 1642 includes the amplifier 1342 shown in FIG. 13 and an amplifier 1612. The amplifier path 1643 includes the amplifier 1343 shown in FIG. 13 and an amplifier 1613. The amplifier path 1644 includes the amplifier 1344 shown in FIG. 13 and an amplifier 1614. Each of the amplifiers 1611-1614 can be implemented using an LNA. As those skilled in the art can appreciate the operation of the RF receiver 1604 shown in FIG. 16 after reading the above paragraphs directed to FIG. 1 to FIG. 15, further description is omitted here for brevity.

Figure 17:
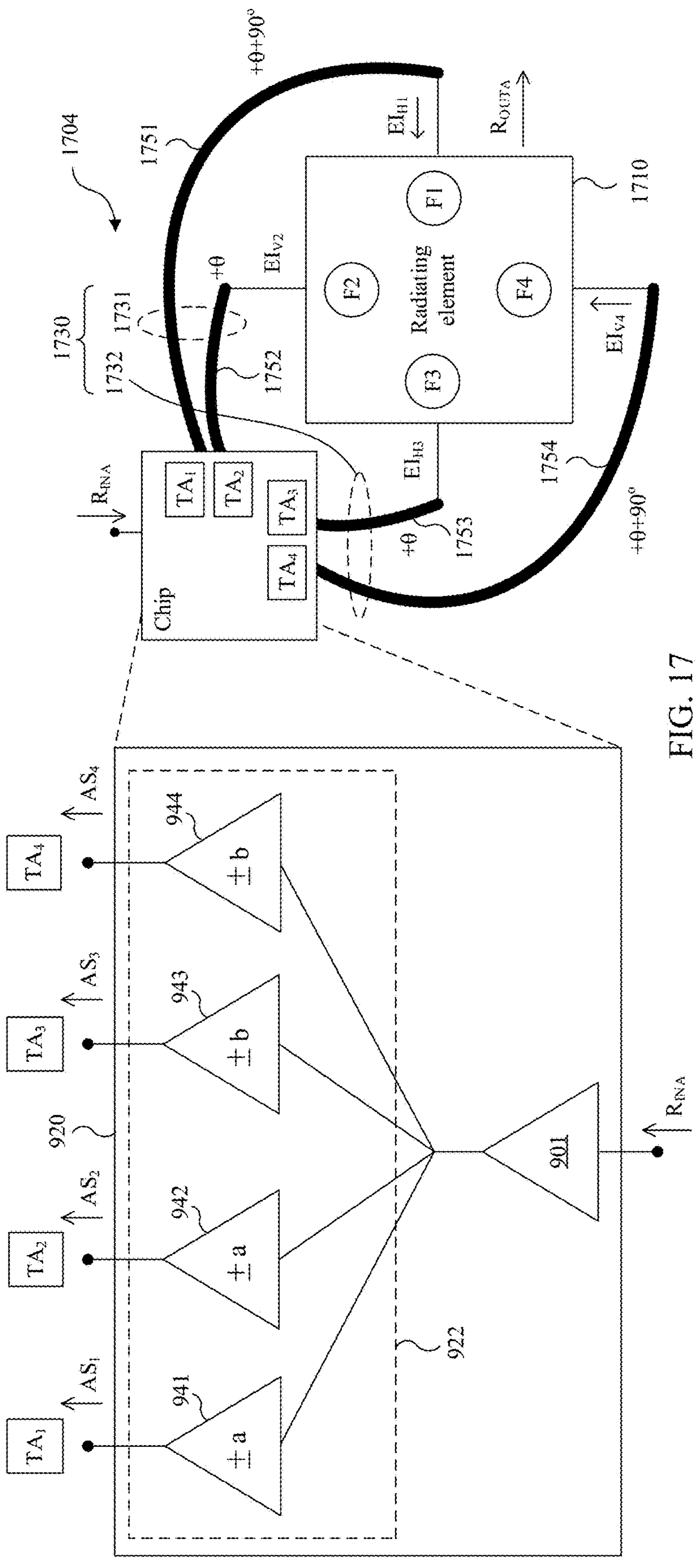
FIG. 17 to FIG. 19 illustrate implementations of the RF transmitter shown in FIG. 2A in accordance with some embodiments of the present disclosure.
Figure 18A:
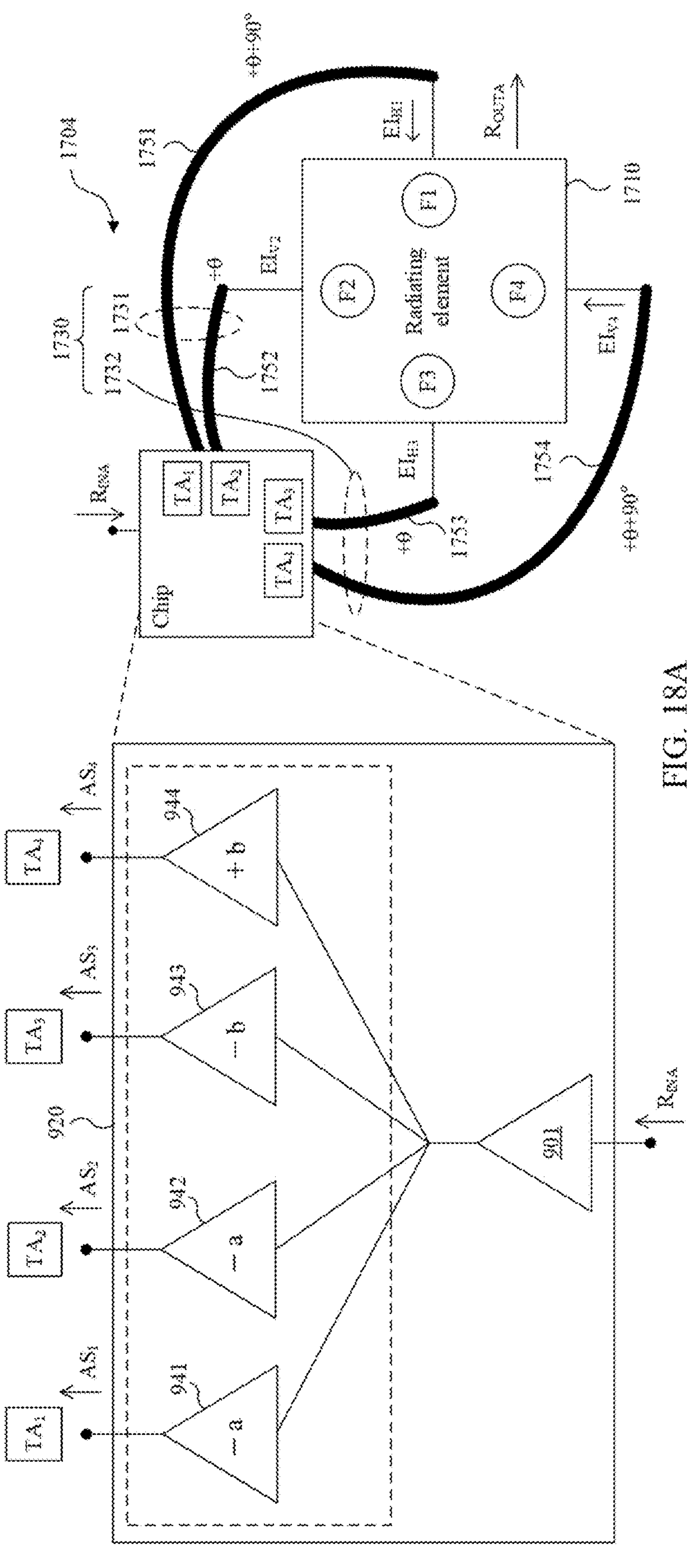
Figure 18B:
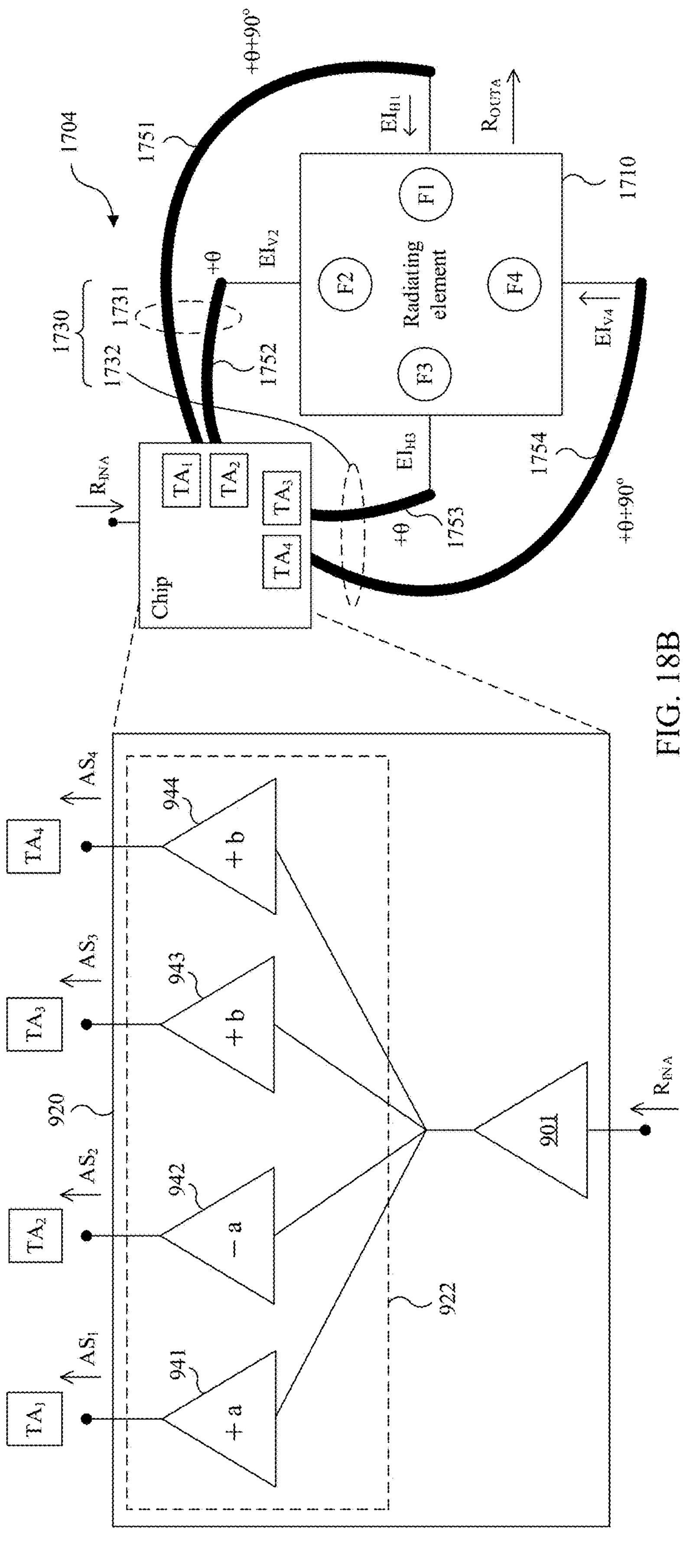
Figure 19:
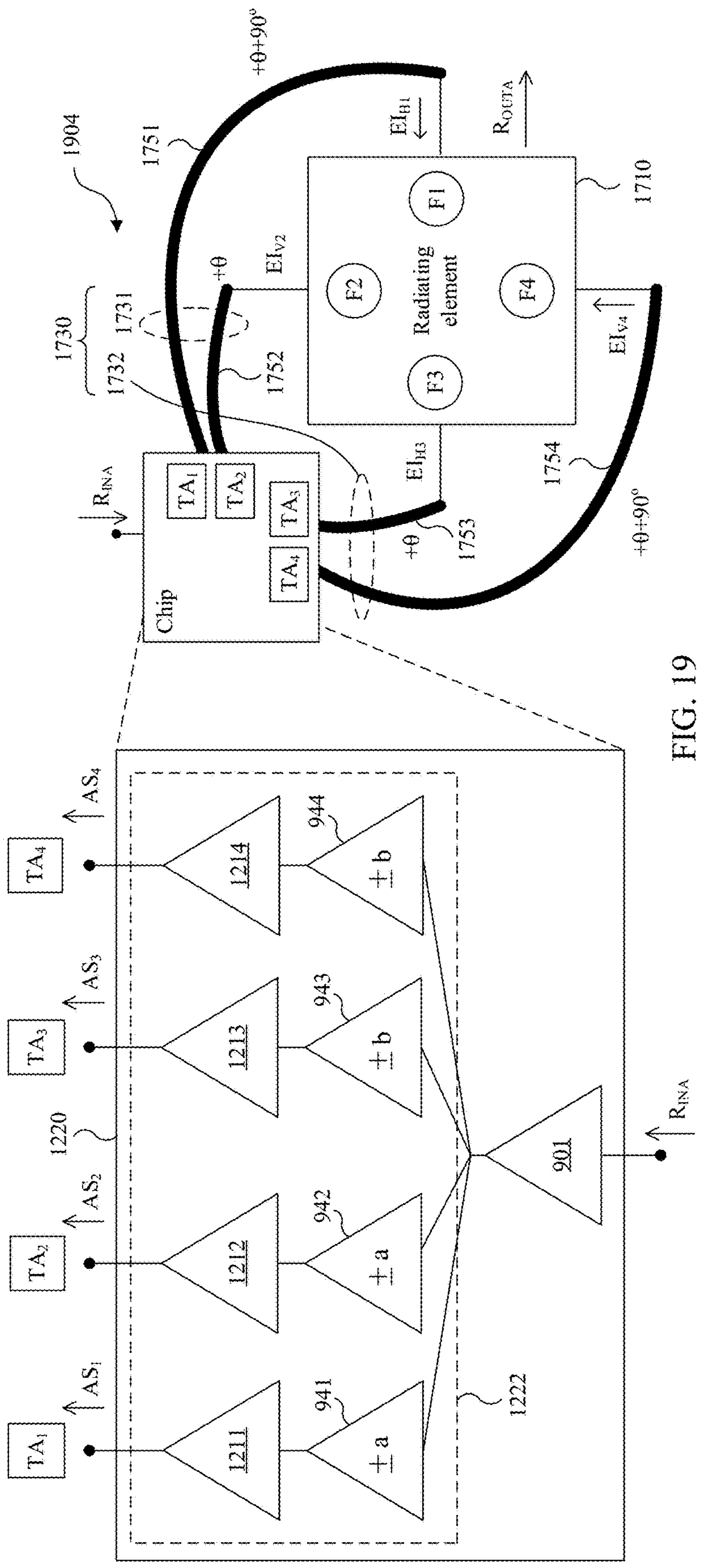
Figure 20:
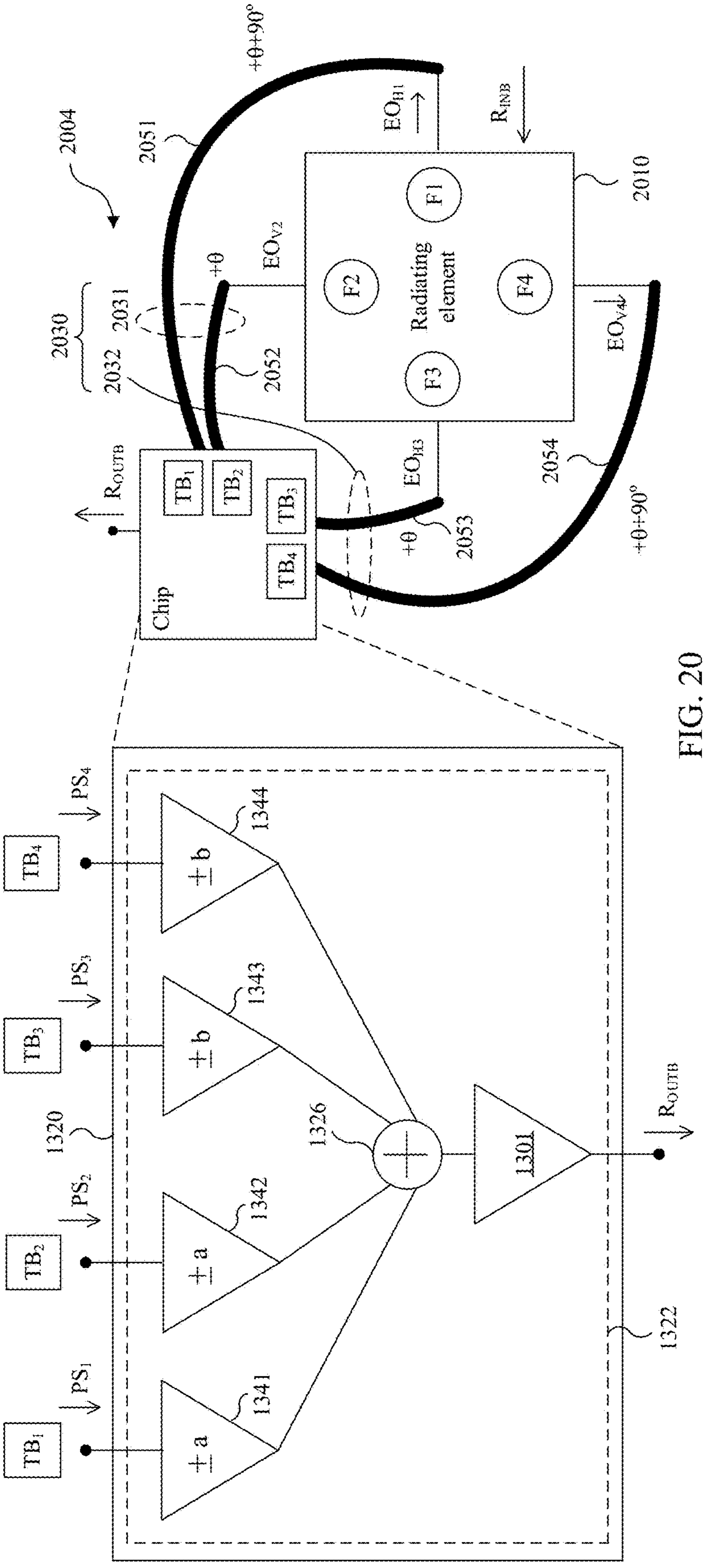
FIG. 20 to FIG. 22 illustrate implementations of the RF receiver shown in FIG. 2B in accordance with some embodiments of the present disclosure.

FIG. 17 to FIG. 19 illustrate implementations of the RF transmitter 204A shown in FIG. 2A in accordance with some embodiments of the present disclosure. FIG. 20 to FIG. 22 illustrate implementations of the RF receiver 204B shown in FIG. 2B in accordance with some embodiments of the present disclosure. In the embodiments shown in FIG. 17 to FIG. 22, a radiating element included in the RF transmitter/receiver is implemented using an antenna element with four feeding points. In addition, the direction of rotation of a circularly polarized wave that the RF transmitter/receiver can emit/receive is selectable.

Referring firstly to FIG. 17, the RF transmitter 1704 can represent an embodiment of the RF transmitter 204A shown in FIG. 2A. The RF transmitter 1704 includes the chip 920 shown in FIG. 9, a radiating element 1710, and a phase shifting circuit 1730. The radiating element 1710 and the phase shifting circuit 1730 can represent embodiments of the radiating element 210A and the phase shifting circuit 230A shown in FIG. 2A, respectively. In the example of FIG. 17, the radiating element 1710 is implemented to include four feeding points F1-F4, which are arranged to receive the electrical signals $EI_{H1}$, $EI_{V2}$, $EI_{H3}$ and $EI_{V4}$, respectively. The radiating element 1710 can receive the electrical signals $EI_{V1}$, $EI_{V2}$, $EI_{H1}$ and $EI_{H2}$ to produce a circularly polarized signal, i.e. the RF output signal $R_{OUTA}$. For example, the radiating element 1710 can generate a vertical component of the RF output signal $R_{OUTA}$ according to the electrical signals $EI_{V2}$ and $EI_{V4}$, and generate a horizontal component of the RF output signal $R_{OUTA}$ according to the electrical signals $EI_{H1}$ and $EI_{H3}$. The electrical signals $EI_{H1}$ and $EI_{V2}$ may be of equal amplitude, and have a phase difference of 90°. The electrical signals $EI_{H3}$ and $EI_{V4}$ may be of equal amplitude, and have a phase difference of 90°.

The phase shifting circuit 1730 includes a plurality of phase shifting stages 1731 and 1732. The phase shifting stage 1731 is configured to phase shift the amplified signals $AS_1$ and $AS_2$ to produce the electrical signals $EI_{H1}$ and $EI_{V2}$ having a phase difference of 90°. In the present embodiment, the phase shifting stage 1731 may include a plurality of transmission lines 1751 and 1752. The transmission line 1751 is arranged to couple the amplified signal $AS_1$ to the feeding point F1, and accordingly generate the electrical signal $EI_{H1}$. The transmission line 1752 is arranged to couple the amplified signal $AS_2$ to the feeding point F2, and accordingly generate the electrical signal $EI_{V2}$. The length of the transmission line 1751 is greater than the length of the transmission line 1752. For example, the transmission line 1752 may shift a phase of the amplified signal $AS_2$ by an angle of +θ, and the transmission line 1751 may shift a phase of the amplified signal $AS_1$ by an angle of (+θ+90°). The length difference between the transmission lines 1751 and 1752 may be equal to a quarter wavelength.

The phase shifting stage 1732 is configured to phase shift the amplified signals $AS_3$ and $AS_4$ to produce the electrical signals $EI_{H3}$ and $EI_{V4}$ having a phase difference of 90°. In the present embodiment, the phase shifting stage 1732 may include a plurality of transmission lines 1753 and 1754. The transmission line 1753 is arranged to couple the amplified signal $AS_3$ to the feeding point F3, and accordingly generate the electrical signal $EI_{H3}$. The transmission line 1754 is arranged to couple the amplified signal $AS_4$ to the feeding point F4, and accordingly generate the electrical signal $EI_{V4}$. The length of the transmission line 1754 is greater than the length of the transmission line 1753. For example, the transmission line 1753 may shift a phase of the amplified signal $AS_3$ by an angle of +θ, and the transmission line 1754 may shift a phase of the amplified signal $AS_4$ by an angle of (+θ+90°). The length difference between the transmission lines 1753 and 1754 may be equal to a quarter wavelength.

In operation, the transmission lines 1751 and 1752 can act as a 90° phase shifter, which can produce the electrical signals $EI_{H1}$ and $EI_{V2}$ according to the amplified signals $AS_1$ and $AS_2$. The transmission lines 1753 and 1754 can act as a 90° phase shifter, which can produce the electrical signals $EI_{H3}$ and $EI_{V4}$ according to the amplified signals $AS_3$ and $AS_4$. The radiating element 1710 can produce an RHCP or LHCP wave according to the electrical signals $EI_{H1}$, $EI_{H3}$, $EI_{V2}$ and $EI_{V4}$.

Note that the transmission lines 1751-1754 can be implemented using, but are not limited to, microstrip lines. In some cases where the radiating element 1710 is implemented using a microstrip antenna, the transmission lines 1751-1754 and the radiating element 1710 can be simultaneously formed on a passive substrate outside the chip 920. In other words, the phase shifting circuit 1730, e.g. two phase shifters, can be designed in conjunction with the radiating element 1710 rather than active devices of the chip 920. The transmission lines 1751-1754 and the radiating element 1710 can be formed or layouted on a passive substrate. The chip area would be reserved for active devices rather than a phase shifter, which thereby reduces the chip size and manufacturing costs. In addition, the structures shown in FIG. 17 are provided for illustrative purposes only, and are not intended to limit the scope of the present disclosure. In some embodiments, the phase shifting stage 1731/1732 shown in FIG. 17 may be implemented to include one or more branch-line couplers.

The RF transmitter 1704 can adjust the direction of rotation of an emitted circularly polarized wave according to respective gain values of the amplifier paths. By way of example but not limitation, the amplifier 941 is arranged to amplify the RF input signal $R_{INA}$ with a gain value, selected from a group including +a and −a, to generate the amplified signal $AS_1$. The amplifier 942 is arranged to amplify the RF input signal $R_{INA}$ with a gain value, selected from a group including +a and −a, to generate the amplified signal $AS_2$. The amplifier 943 is arranged to amplify the RF input signal $R_{INA}$ with a gain value, selected from a group including +b and −b, to generate the amplified signal $AS_3$. The amplifier 944 is arranged to amplify the RF input signal $R_{INA}$ with a gain value, selected from a group including +b and −b, to generate the amplified signal $AS_4$.

In some embodiments, when the gain value of the amplifier 941 is equal to the gain value of the amplifier 942, and the gain value of the amplifier 943 is opposite of the gain value of the amplifier 944, the RF output signal $R_{OUTA}$ outputted from the radiating element 1710 is circularly polarized in one direction. In some embodiments, when the gain value of the amplifier 941 is opposite of the gain value of the amplifier 942, and the gain value of the amplifier 943 is equal to the gain value of the amplifier 944, the RF output signal $R_{OUTA}$ outputted from the radiating element 1710 is circularly polarized in another direction.

FIG. 18A is a diagram illustrating an exemplary gain configuration of the amplifier circuit 922 shown in FIG. 17. In the present embodiment, the RF transmitter 1704 can emit an LHCP wave according to the gain configuration of the amplifier circuit 922. In other words, the RF output signal $R_{OUTA}$ can rotate in a left-handed sense or a counter-clockwise direction. For illustrative purposes, the RF input signal $R_{INA}$ may be a cosine wave represented as cos(ωt), where ω is an angular frequency and t is time. To emit an LHCP wave, the radiating element 1710 may receive a first signal component represented as $+b\cdot\cos(\omega t)-a\cdot\sin(\omega t)$, and a second signal component represented as $+a\cdot\cos(\omega t)+b\cdot\sin(\omega t)$. The first signal component is associated with a horizontal component of the LHCP wave, and the second signal component is associated with a vertical component of the LHCP wave. Thus, the gain values of the amplifiers 941-944 can be set to −a, −a, −b and +b, respectively.

FIG. 18B is a diagram illustrating an exemplary gain configuration of the amplifier circuit 922 shown in FIG. 17. In the present embodiment, the RF transmitter 1704 can emit an RHCP wave according to the gain configuration of the amplifier circuit 922. In other words, the RF output signal $R_{OUTA}$ can rotate in a right-handed sense or a clockwise direction. For illustrative purposes, the RF input signal $R_{INA}$ may be a cosine wave represented as cos(ωt), where ω is an angular frequency and t is time. To emit an RHCP wave, the radiating element 1710 may receive a first signal component represented as $-b\cdot\cos(\omega t)+a\cdot\sin(\omega t)$, and a second signal component represented as $+a\cdot\cos(\omega t)+b\cdot\sin(\omega t)$. The first signal component is associated with a horizontal component of the LHCP wave, and the second signal component is associated with a vertical component of the LHCP wave. Thus, the gain values of the amplifiers 941-944 can be set to +a, −a, +b and +b, respectively.

In some embodiments, the amplifier circuit 922 shown in FIG. 17 may include other circuit elements. Referring to FIG. 19, the RF transmitter 1904 can represent another embodiment of the RF transmitter 204A shown in FIG. 2A. The structure of the RF transmitter 1904 is similar/identical to the structure of the RF transmitter 1704 shown in FIG. 17 except that the chip 1220 shown in FIG. 12 is used for amplifying the RF input signal $R_{INA}$. As those skilled in the art can appreciate the operation of the RF transmitter 1904 shown in FIG. 19 after reading the above paragraphs directed to FIG. 1 to FIG. 18B, further description is omitted here for brevity.

FIG. 20 is a diagram illustrating an implementation of the RF receiver 204B shown in FIG. 2B in accordance with some embodiments of the present disclosure. The RF receiver 2004 includes the chip 1320 shown in FIG. 13, a radiating element 2010 and a phase shifting circuit 2030. The radiating element 2010 and the phase shifting circuit 2030 can represent embodiments of the radiating element 210B and the phase shifting circuit 230B shown in FIG. 2B respectively. In the example of FIG. 20, the radiating element 2010 is implemented to include four feeding points F1-F4, which are arranged to output the electrical signals $EO_{H1}$, $EO_{V2}$, $EO_{H3}$ and $EO_{V4}$, respectively. For example, the radiating element 2010 can receive a circularly polarized electromagnetic wave, i.e. the RF input signal $R_{INB}$, to produce the electrical signals $EO_{H1}$, $EO_{V2}$, $EO_{H3}$ and $EO_{V4}$. The electrical signals $EO_{H1}$ and $EO_{H3}$ may be produced in response to a vertical component of the RF input signal $R_{INB}$. The electrical signals $EO_{V2}$ and $EO_{V4}$ may be produced in response to a horizontal component of the RF input signal $R_{INB}$. The electrical signals $EO_{H1}$ and $EO_{V2}$ may be of equal amplitude, and have a phase difference of 90°. The electrical signals $EO_{H3}$ and $EO_{V4}$ may be of equal amplitude, and have a phase difference of 90°.

The phase shifting circuit 2030 includes a plurality of phase shifting stages 2031 and 2032. The phase shifting stage 2031 is configured to phase shift the electrical signals $EO_{H1}$ and $EO_{V2}$ to generate the phase shifted signals $PS_1$ and $PS_2$. In the present embodiment, the phase shifting stage 2031 may include a plurality of transmission lines 2051 and 2052. The transmission line 2051 is arranged to couple the electrical signal $EO_{H1}$ to the input terminal $TB_1$, and accordingly generate the phase shifted signal $PS_1$. The transmission line 2052 is arranged to couple the electrical signal $EO_{V2}$ to the input terminal $TB_2$, and accordingly generate the phase shifted signal $PS_2$. The length of the transmission line 2051 is greater than the length of the transmission line 2052. For example, the transmission line 2052 may shift a phase of the electrical signal $EO_{V2}$ by an angle of $+\theta$, and the transmission line 2051 may shift a phase of the electrical signal $EO_{H1}$ by an angle of $(+\theta+90°)$. The length difference between the transmission lines 2051 and 2052 may be equal to a quarter wavelength.

The phase shifting stage 2032 is configured to phase shift the electrical signals $EO_{H3}$ and $EO_{V4}$ to generate the phase shifted signals $PS_3$ and $PS_4$. In the present embodiment, the phase shifting stage 2032 may include a plurality of transmission lines 2053 and 2054. The transmission line 2053 is arranged to couple the electrical signal $EO_{H3}$ to the input terminal $TB_3$, and accordingly generate the phase shifted signal $PS_3$. The transmission line 2054 is arranged to couple the electrical signal $EO_{V4}$ to the input terminal $TB_4$, and accordingly generate the phase shifted signal $PS_4$. The length of the transmission line 2054 is greater than the length of the transmission line 2053. For example, the transmission line 2053 may shift a phase of the electrical signal $EO_{H3}$ by an angle of $+\theta$, and the transmission line 2054 may shift a phase of the electrical signal $EO_{V4}$ by an angle of $(+\theta+90°)$. The length difference between the transmission lines 2053 and 2054 may be equal to a quarter wavelength.

In operation, the radiating element 2010 can receive an RHCP or LHCP wave according to output the electrical signals $EO_{H1}$, $EO_{H3}$, $EO_{V2}$ and $EO_{V4}$. The transmission lines 2051 and 2052 can act as a 90° phase shifter, which can generate the phase shifted signals $PS_1$ and $PS_2$ according to the electrical signals $EO_{H1}$ and $EO_{V2}$. The transmission lines 2053 and 2054 can act as a 90° phase shifter, which can generate the phase shifted signals $PS_3$ and $PS_4$ according to the electrical signals $EO_{H3}$ and $EO_{V4}$. The amplifier circuit 1322 can amplify the phase shifted signals $PS_1$-$PS_4$ at the input terminals $TB_1$-$TB_4$ to thereby generate the RF output signal $R_{OUTB}$.

Note that the phase shifting circuit 2030, e.g. two 90° phase shifters, can be designed in conjunction with the radiating element 2010 rather than active devices of the chip 1320. In other words, the transmission lines 2051-2054 and the radiating element 2010 can be formed or layouted on a passive substrate. The chip area would be reserved for active devices rather than a phase shifter, which thereby reduces the chip size and manufacturing costs. In addition, the structures shown in FIG. 20 are provided for illustrative purposes only, and are not intended to limit the scope of the present disclosure. In some embodiments, the phase shifting stage 2031/2032 shown in FIG. 20 may be implemented to include one or more branch-line couplers.

The RF receiver 2004 can adjust respective gain values of the amplifier paths to receive a circularly polarized wave rotating in a predetermined direction. By way of example but not limitation, the amplifier 1341 is arranged to amplify the phase shifted signal $PS_1$ with a gain value, selected from a group including +a and −a, to generate the amplified signal $SG_1$. The amplifier 1342 is arranged to amplify the phase shifted signal $PS_2$ with a gain value, selected from a group including +a and −a, to generate the amplified signal $SG_2$. The amplifier 1343 is arranged to amplify the phase shifted signal $PS_3$ with a gain value, selected from a group including +b and −b, to generate the amplified signal $SG_3$. The amplifier 1344 is arranged to amplify the phase shifted signal $PS_4$ with a gain value, selected from a group including +b and −b, to generate the amplified signal $SG_4$.

In some embodiments, when the gain value of the amplifier 1341 is equal to the gain value of the amplifier 1342, and the gain value of the amplifier 1343 is opposite of the gain value of the amplifier 1344, the radiating element 2010 can receive the RF input signal $R_{INB}$ which is circularly polarized in one direction. In some embodiments, when the gain value of the amplifier 1341 is opposite of the gain value of the amplifier 1342, and the gain value of the amplifier 1343 is equal to the gain value of the amplifier 1344, the radiating element 2010 can receive the RF input signal $R_{INB}$ which is circularly polarized in another direction.

Figure 21A:
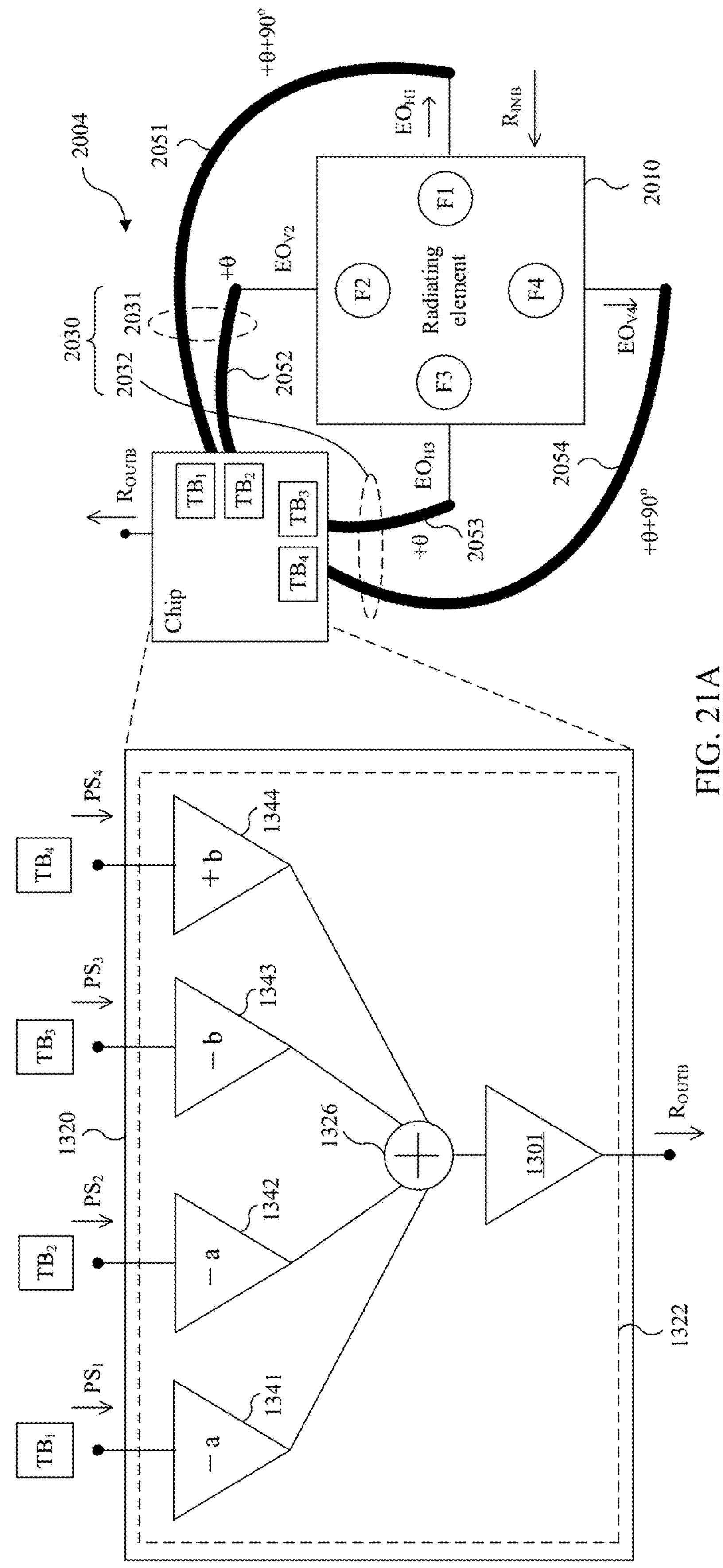
Figure 22:
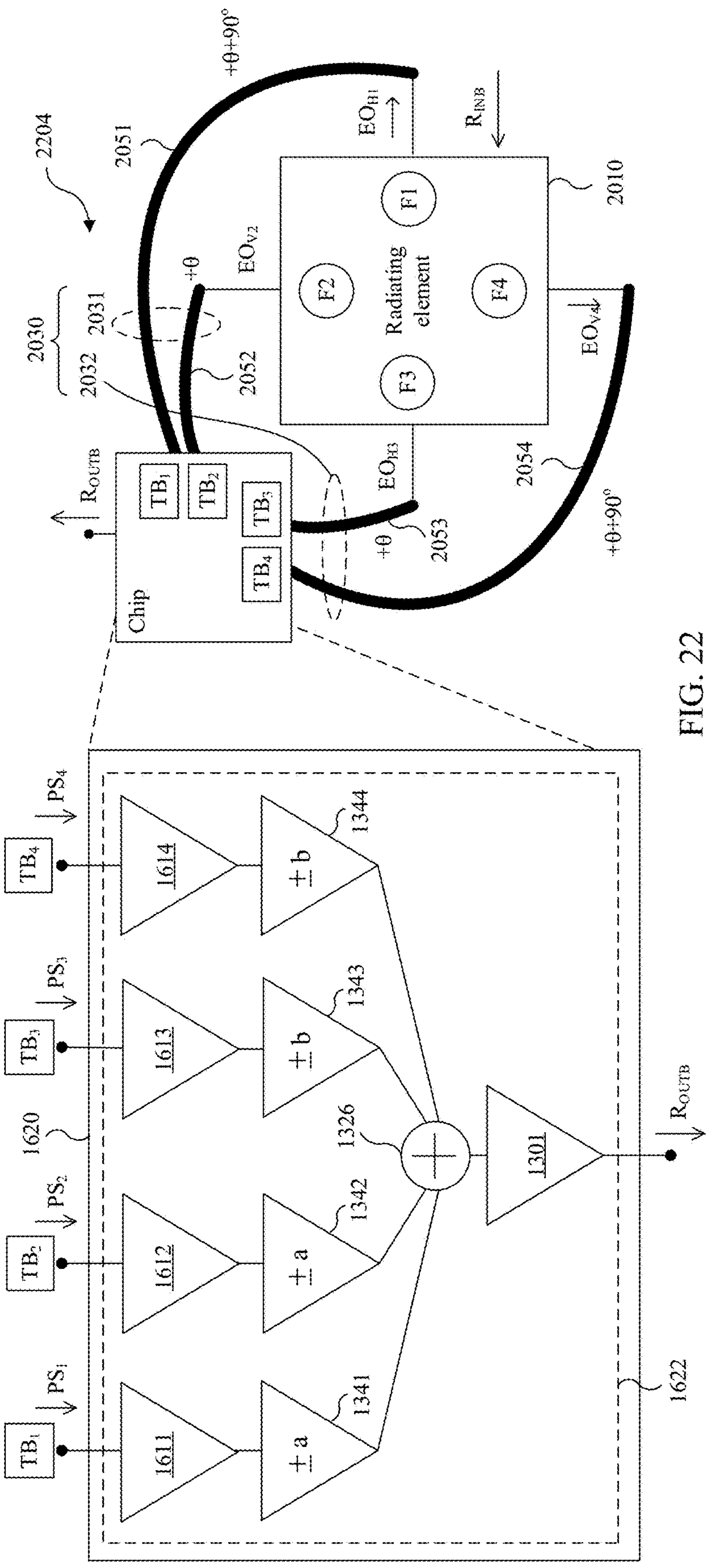

FIG. 21A is a diagram illustrating an exemplary gain configuration of the amplifier circuit 1322 shown in FIG. 20. In the present embodiment, the RF receiver 1304 is configured to receive an LHCP wave according to the gain configuration of the amplifier circuit 1322. In other words, the RF input signal $R_{INB}$ inputted to the radiating element 2010 rotates in a left-handed sense or a counter-clockwise direction. The radiating element 2010 can output a first signal component and a second signal component in response to a horizontal component and a vertical component of the LHCP wave, respectively. The first signal component and the second signal component can be represented as α·sin(ωt) and α·cos(ωt), respectively, where α is an amplitude, ω is an angular frequency and t is time. For example, the electrical signals $EO_{H1}$ and $EO_{H3}$ may be represented as 0.5α·sin(ωt) and −0.5α·sin(ωt), respectively. The electrical signals $EO_{V4}$ and $EO_{V2}$ may be represented as 0.5α·cos(ωt) and −0.5α·cos(ωt), respectively. To preserve information carried by the electrical signals $EO_{H1}$, $EO_{V2}$, $EO_{H3}$ and $EO_{V4}$, the amplifier circuit 1322 may set the gain values of the amplifiers 1341-1344 to −a, −a, −b and +b, respectively, thereby outputting the RF output signal $R_{OUTB}$ represented as α·(a·cos(ωt)+b·sin(ωt)).

Figure 21B:
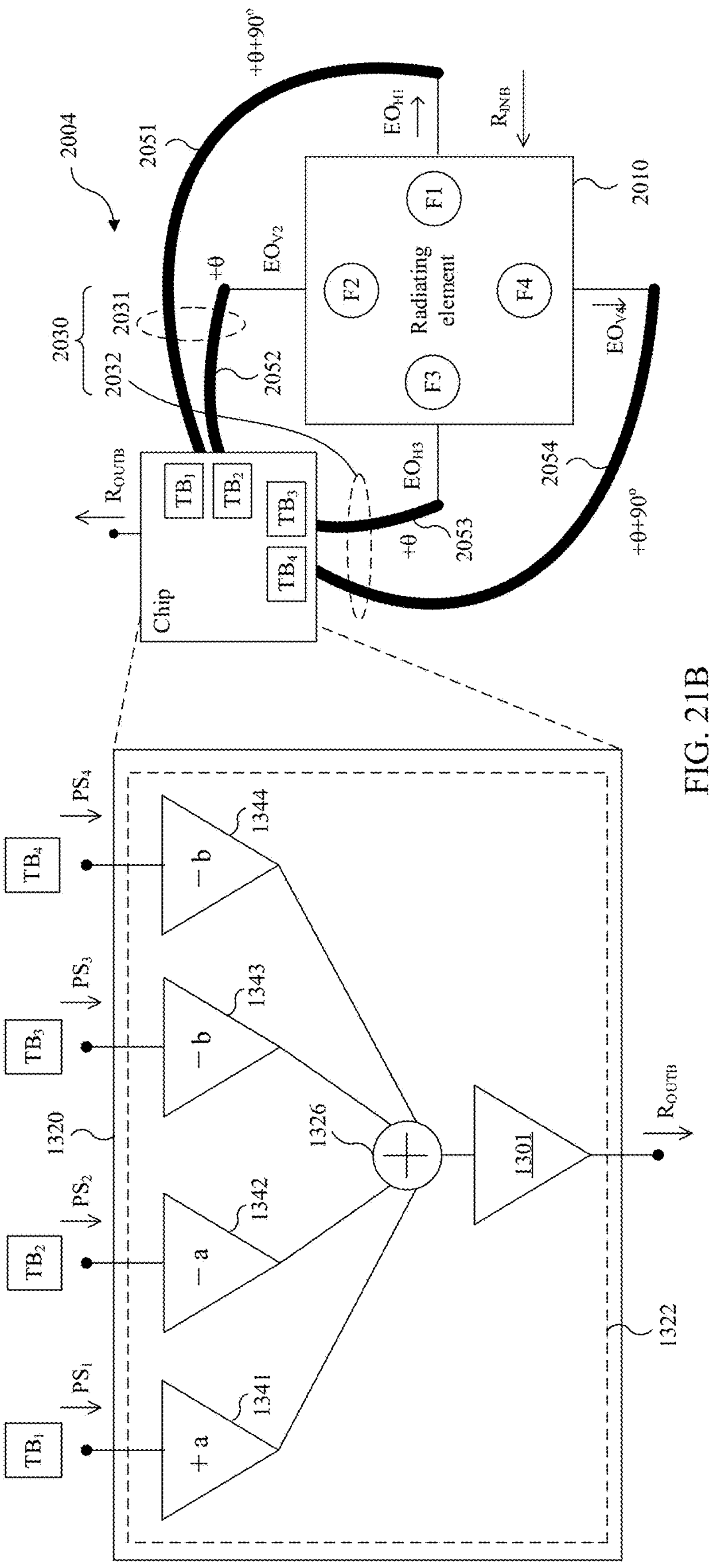

FIG. 21B is a diagram illustrating an exemplary gain configuration of the amplifier circuit 1322 shown in FIG. 20. In the present embodiment, the RF receiver 1304 is configured to receive an RHCP wave according to the gain configuration of the amplifier circuit 1322. In other words, the RF input signal $R_{INB}$ inputted to the radiating element 2010 rotates in a right-handed sense or a clockwise direction. The radiating element 2010 can output a first signal component and a second signal component in response to a horizontal component and a vertical component of the RHCP wave, respectively. The first signal component and the second signal component can be represented as α·cos (ωt) and α·sin(ωt), respectively, where α is an amplitude, ω is an angular frequency and t is time. For example, the electrical signals $EO_{H1}$ and $EO_{H3}$ may be represented as 0.5α·cos(ωt) and −0.5α·cos(ωt), respectively. The electrical signals $EO_{V4}$ and $EO_{V2}$ may be represented as 0.5α·sin(ωt) and −0.5α·sin(ωt), respectively. To preserve information carried by the electrical signals $EO_{H1}$, $EO_{V2}$, $EO_{H3}$ and $EO_{V4}$, the amplifier circuit 1322 may set the gain values of the amplifiers 1341-1344 to +a, −a, −b and −b, respectively, thereby outputting the RF output signal $R_{OUTB}$ represented as α·(b·cos(ωt)+a·sin(ωt)).

In some embodiments, the amplifier circuit 1322 shown in FIG. 20 may include other circuit elements. Referring to FIG. 22, the RF receiver 2204 can represent another embodiment of the RF receiver 204B shown in FIG. 2B. The structure of the RF receiver 2204 is similar/identical to the structure of the RF receiver 2004 shown in FIG. 20 except that the chip 1620 shown in FIG. 16 is used for outputting the RF output signal $R_{OUTB}$. As those skilled in the art can appreciate the operation of the RF receiver 2204 shown in FIG. 22 after reading the above paragraphs directed to FIG. 1 to FIG. 21B, further description is omitted here for brevity.

Figure 23:
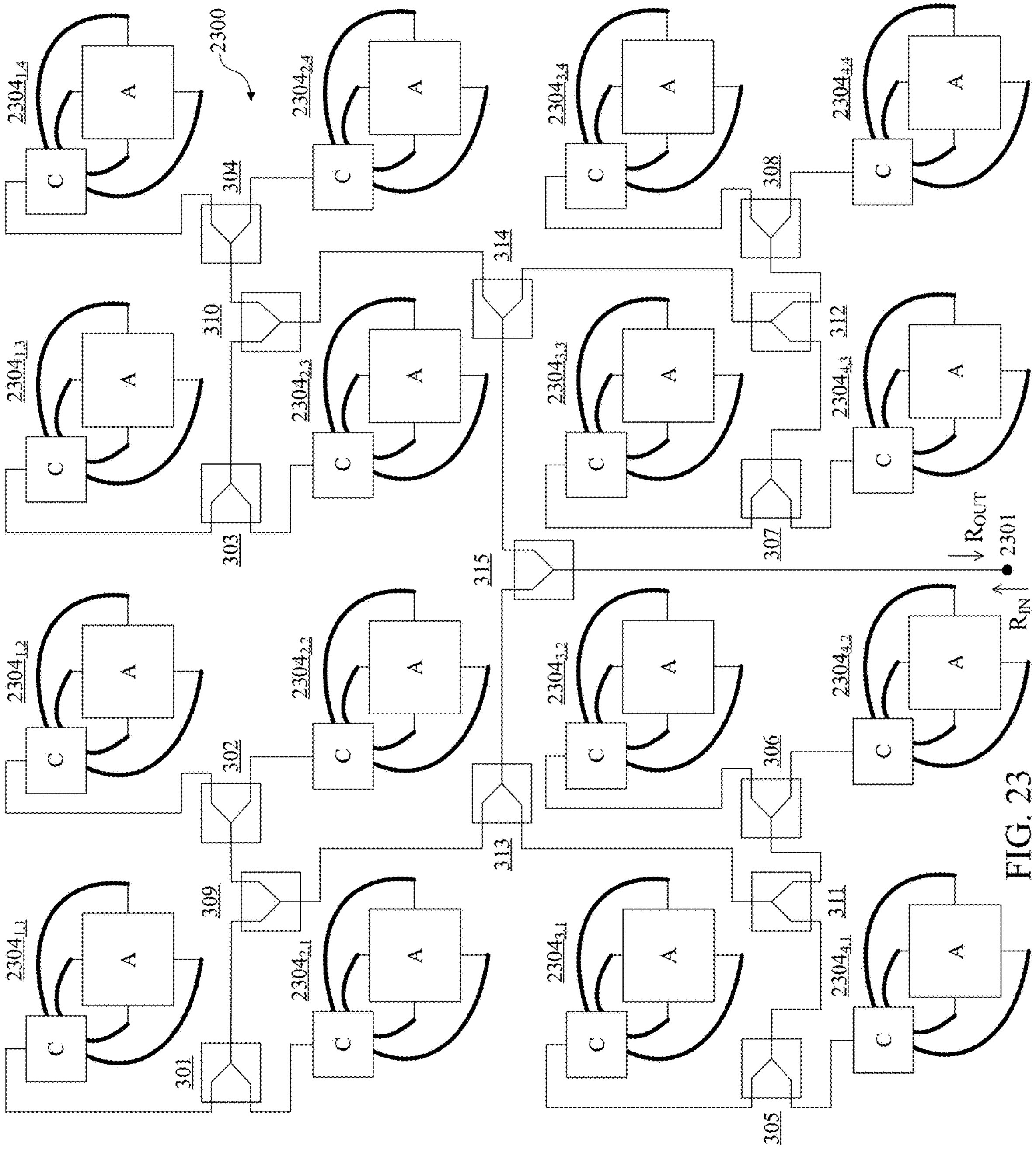
FIG. 23 is a diagram illustrating exemplary interconnection between array elements of a phased array in accordance with some embodiments of the present disclosure.

FIG. 23 is a diagram illustrating exemplary interconnection between array elements of a phased array in accordance with some embodiments of the present disclosure. The phased array 2300 can serve as an embodiment of the phased array 100 shown in FIG. 1. The phased array 2300 includes a plurality of signal couplers 301-315 and a plurality of array elements $\mathbf{2304}_{1,1}$-$\mathbf{2304}_{4,4}$. The signal couplers 301-315 are coupled in a binary tree configuration. For example, each of the signal couplers 301-308 is at a first level, and is arranged to couple two array elements to a signal coupler at a second level higher than the first level. Each of the signal couplers 309-312 is at the second level, and is arranged to couple two signal couplers at the first level to a signal coupler at a third level higher than the second level.

The array elements $\mathbf{2304}_{1,1}$-$\mathbf{2304}_{4,4}$ can serve as an embodiment of the array elements $\mathbf{104}_{1,1}$-$\mathbf{104}_{m,n}$ shown in FIG. 1. In the present embodiment, when the phased array 2300 is implemented as a phased array transmitter, each of the array elements $\mathbf{2304}_{1,1}$-$\mathbf{2304}_{4,4}$ can be implemented using the RF transmitter 1704 shown in FIG. 17. In other words, each of the array elements $\mathbf{2304}_{1,1}$-$\mathbf{2304}_{4,4}$ can include the radiating element (labeled A), the chip (labeled C) and the four transmission lines shown in FIG. 17. However, those skilled in the art can appreciate that each of the array elements $\mathbf{2304}_{1,1}$-$\mathbf{2304}_{4,4}$ can be implemented using any of the RF transmitters described above without departing from the scope of the present disclosure. In addition, each of the signal couplers 301-315 can operate as a power splitter. The RF input signal $R_{IN}$ can be sent to the RF port 2301.

When the phased array 2300 is implemented as a phased array receiver, each of the array elements $\mathbf{2304}_{1,1}$-$\mathbf{2304}_{4,4}$ can be implemented using the RF receiver 2004 shown in FIG. 20. In other words, each of the array elements $\mathbf{2304}_{1,1}$-$\mathbf{2304}_{4,4}$ can include the radiating element, the chip and the four transmission lines shown in FIG. 20. However, those skilled in the art can appreciate that each of the array elements $\mathbf{2304}_{1,1}$-$\mathbf{2304}_{4,4}$ can be implemented using any of the RF receivers described above without departing from the scope of the present disclosure. In addition, each of the signal couplers 301-315 can operate as a power combiner. The RF output signal $R_{OUT}$ can be outputted from the RF port 2301.

As those skilled in the art can appreciate the operation of the phased array 2300 shown in FIG. 23 after reading the above paragraphs directed to FIG. 1 to FIG. 22, further description is omitted here for brevity.

Figure 24:
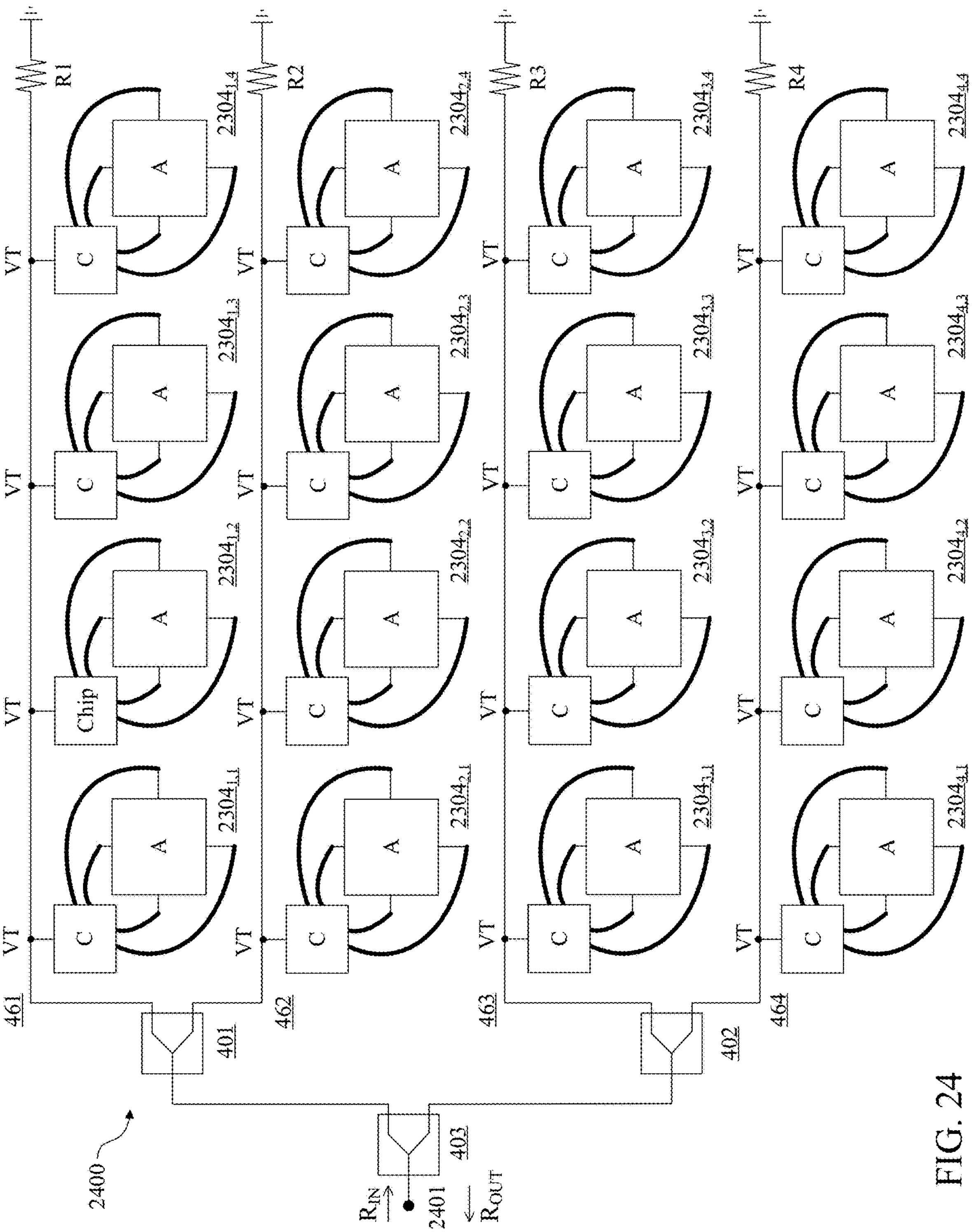
FIG. 24 is a diagram illustrating exemplary interconnection between array elements of a phased array in accordance with some embodiments of the present disclosure.

FIG. 24 is a diagram illustrating exemplary interconnection between array elements of a phased array in accordance with some embodiments of the present disclosure. The phased array 2400 can serve as an embodiment of the phased array 100 shown in FIG. 1. The phased array 2400 includes the array elements $\mathbf{2304}_{1,1}$-$\mathbf{2304}_{4,4}$ shown in FIG. 23, a plurality of transmission lines 461-464, a plurality of resistive elements R1-R4, and a plurality of signal couplers 401-403. The array elements arranged in the same row are coupled to the same transmission line. Each of the signal couplers 401 and 402 is arranged to couple two transmission lines to the signal coupler 403.

When the phased array 2400 is implemented as a phased array transmitter, each of the array elements $\mathbf{2304}_{1,1}$-$\mathbf{2304}_{4,4}$ is implemented as an RF transmitter. The RF input signal $R_{IN}$ can be sent to the RF port 2401, and each of the signal couplers 401-403 can operate as a power splitter. An RF signal can be inputted to each RF transmitter arranged in the same row through a corresponding voltage tap VT. When the phased array 2400 is implemented as a phased array receiver, each of the array elements $\mathbf{2304}_{1,1}$-$\mathbf{2304}_{4,4}$ is implemented as an RF receiver. Each of the signal couplers 401-403 can operate as a power splitter. An RF signal, e.g. a current signal, outputted from each RF receiver arranged in the same row can be transmitted to a corresponding power combiner. The RF output signal $R_{OUT}$ can be outputted from the RF port 2401.

As those skilled in the art can appreciate the operation of the phased array 2400 shown in FIG. 24 after reading the above paragraphs directed to FIG. 1 to FIG. 22, further description is omitted here for brevity.

Figure 25:
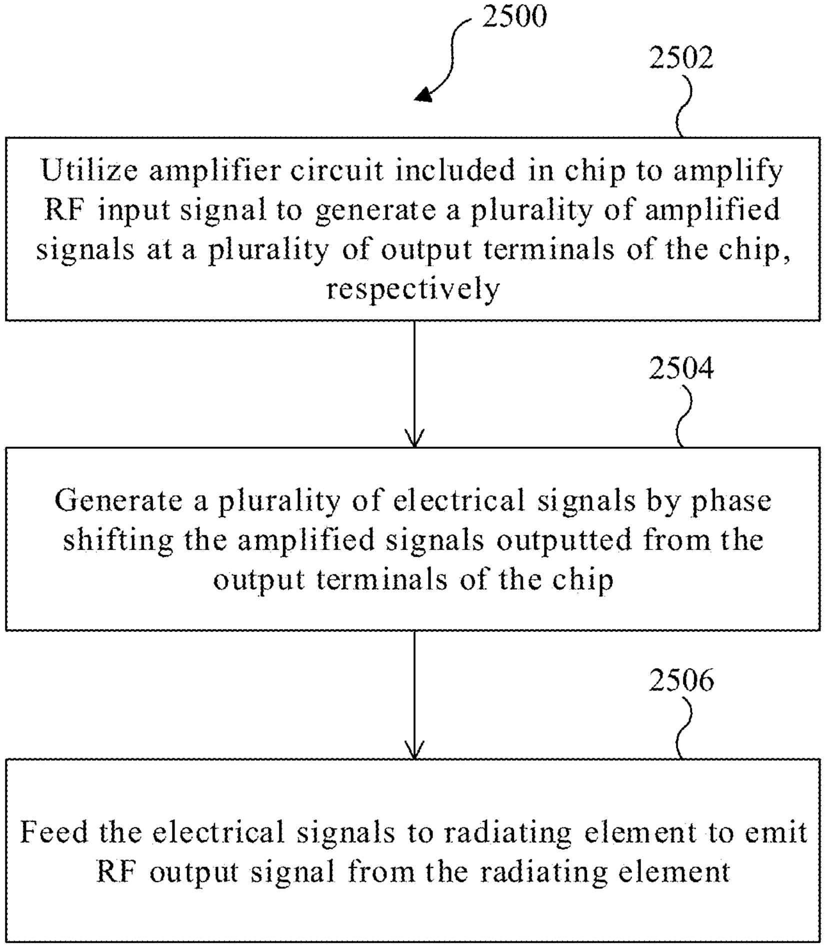
FIG. 25 is a flow chart of an exemplary method for emitting an RF output signal in accordance with some embodiments of the present disclosure.

FIG. 25 is a flow chart of an exemplary method for emitting an RF output signal in accordance with some embodiments of the present disclosure. The operation described with reference to at least one of the aforementioned RF transmitters may be summarized in the flow chart of FIG. 25. For illustrative purposes, the method 2500 is described below with reference to the RF transmitter 204A shown in FIG. 2A. Note that the method 2500 can be employed by each array element shown in FIG. 1 when the array element is implemented as an RF transmitter. For example, the method 2500 can be employed by at least one of the RF transmitters described with reference to FIG. 3 to FIG. 5, FIG. 9 to FIG. 12, and FIG. 17 to FIG. 19. As another example, the method 2500 can be employed by at least one array element described with reference to FIG. 23 and FIG. 24. Moreover, in some embodiments, other operations in the method 2500 can be performed.

At operation 2502, an amplifier circuit included in a chip is utilized to amplify an RF input signal, thereby generating a plurality of amplified signals at a plurality of output terminals of the chip, respectively. For example, the amplifier circuit 222A can amplify the RF input signal $R_{INA}$ to generate the amplified signals $AS_1$-$AS_P$ at the output terminals $TA_1$-$TA_P$, respectively.

At operation 2504, a plurality of electrical signals are generated by phase shifting the amplified signals outputted from the output terminals of the chip. For example, the phase shifting circuit 230A, located outside the chip 220A, can receive and phase shift the amplified signals $AS_1$-$AS_P$ to generate the electrical signals {EI}.

At operation 2506, the electrical signals are fed to a radiating element to emit the RF output signal from the radiating element. For example, the radiating element 210A can emit the RF output signal $R_{OUTA}$ in response to the electrical signals {EI} fed thereto.

In some embodiments, the electrical signals fed to the radiating element may include two electrical signals, which are of equal amplitude and have a phase difference of 90 degrees. For example, the radiating element 210A may be implemented using a dual-feed antenna. The radiating element 210A can receive two electrical signals through two feeding points thereof, and accordingly produce the RF output signal $R_{OUTA}$.

In some embodiments, the electrical signals fed to the radiating element may include four electrical signals. Two of the four electrical signals are of equal amplitude and have a phase difference of 90 degrees. The other two are of equal amplitude and have a phase difference of 90 degrees. For example, the radiating element 210A may be implemented using a four-feed antenna. The radiating element 210A can receive four electrical signals through four feeding points thereof, and accordingly produce the RF output signal $R_{OUTA}$.

In some embodiments, the emitted RF output signal may be a circularly polarized wave, whose direction of rotation is adjustable. For example, the direction of rotation of the RF output signal $R_{OUTA}$ may vary in response to the gain configuration of the amplifier circuit 222A.

In some embodiments, the phase shifting operation (i.e. operation 2504) can be performed outside the chip where the amplification of the RF input signal is carried out. For example, the phase shifting operation can be performed using a phase shifting circuit formed on a substrate where the radiating element is formed. The substrate may be implemented using a PCB, a glass substrate or multiple types of insulating substrates. As another example, the phase shifting circuit may be implemented using passive circuit elements such as microstrip lines. The phase shifting circuit and the radiating element may be formed or layouted on the same passive substrate.

As those skilled in the art can appreciate the operation of the method 2500 after reading the above paragraphs directed to FIG. 1 through FIG. 24, further description is omitted here for brevity.

Figure 26:
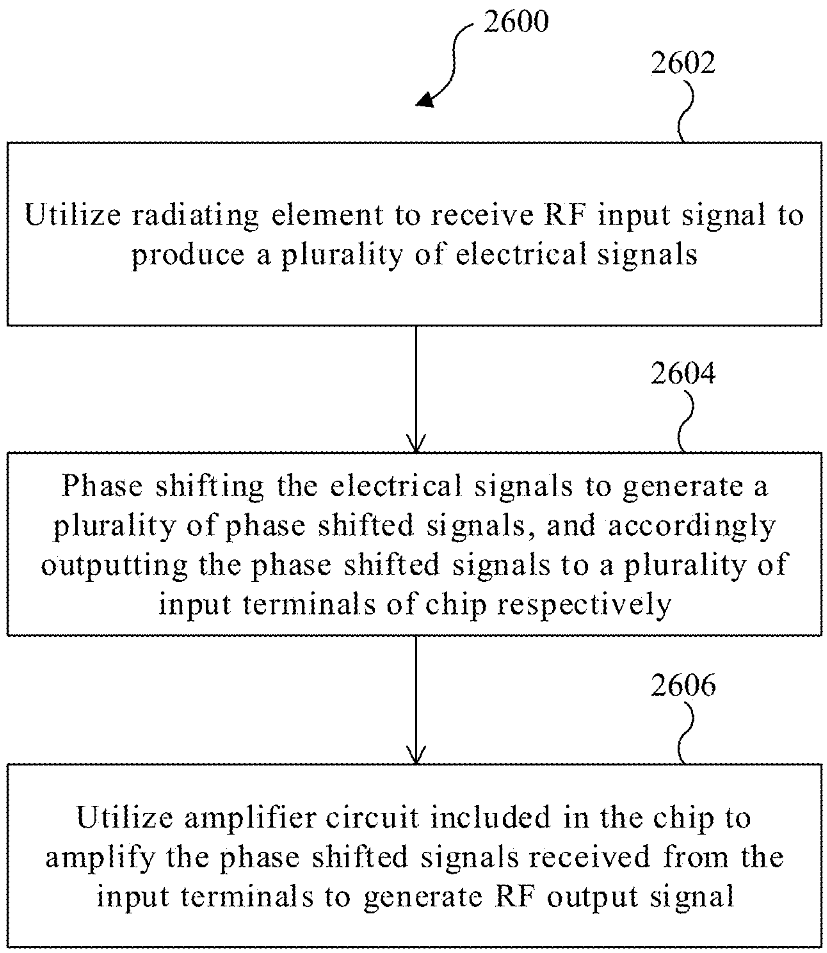
FIG. 26 is a flow chart of an exemplary method for receiving an RF input signal in accordance with some embodiments of the present disclosure.

FIG. 26 is a flow chart of an exemplary method for receiving an RF input signal in accordance with some embodiments of the present disclosure. The operation described with reference to at least one of the aforementioned RF receivers may be summarized in the flow chart of FIG. 26. For illustrative purposes, the method 2600 is described below with reference to the RF transmitter 204B shown in FIG. 2B. Note that the method 2600 can be employed by each array element shown in FIG. 1 when the array element is implemented as an RF receiver. For example, the method 2600 can be employed by at least one of the RF receivers described with reference to FIG. 6 to FIG. 8, FIG. 13 to FIG. 16, and FIG. 20 to FIG. 22. As another example, the method 2600 can be employed by at least one array element described with reference to FIG. 23 and FIG. 24. Moreover, in some embodiments, other operations in the method 2600 can be performed.

At operation 2602, a radiating element is utilized to receive the RF input signal to produce a plurality of electrical signals. For example, the radiating element 210B can receive the RF input signal $R_{INB}$ to produce the electrical signals {EO}.

At operation 2604, the electrical signals are phase shifted to generate a plurality of phase shifted signals, thereby outputting the phase shifted signals to a plurality of input terminals of a chip respectively. For example, the phase shifting circuit 230B can phase shift the electrical signals {EO} to generate the phase shifted signals $PS_1$-$PS_Q$, and accordingly output the phase shifted signals $PS_1$-$PS_Q$ to the input terminals $TB_1$-$TB_Q$, respectively.

At operation 2606, an amplifier circuit included in the chip is utilized to amplify the phase shifted signals received from the input terminals, thereby generating an RF output signal. For example, the amplifier circuit 222B can receive and amplify the phase shifted signals $PS_1$-$PS_Q$, thereby generating the RF output signal $R_{OUTB}$.

In some embodiments, the electrical signals outputted from the radiating element may include two electrical signals, which are of equal amplitude and have a phase difference of 90 degrees. For example, the radiating element 210B may be implemented using a dual-feed antenna. The radiating element 210B can produce two electrical signals at two feeding points thereof, respectively, in response to the RF input signal $R_{INB}$.

In some embodiments, the electrical signals outputted from the radiating element may include four electrical signals. Two of the four electrical signals are of equal amplitude and have a phase difference of 90 degrees. The other two are of equal amplitude and have a phase difference of 90 degrees. For example, the radiating element 210B may be implemented using a four-feed antenna. The radiating element 210B can produce four electrical signals at four feeding points thereof, respectively, in response to the RF input signal $R_{INB}$.

In some embodiments, the RF input signal implemented using a circularly polarized wave can be successfully received even if the direction of rotation of the circularly polarized wave changes. For example, the RF receiver 204B can selectively adjust the gain configuration of the amplifier circuit 222B in response to the direction of rotation of the RF input signal $R_{INB}$, thereby successfully receiving the RF input signal $R_{INB}$.

In some embodiments, the phase shifting operation (i.e. operation 2604) can be performed outside the chip where the amplification of the phase shifted signals is carried out. For example, the phase shifting operation can be performed using a phase shifting circuit formed on a substrate where the radiating element is formed. The substrate may be implemented using a PCB, a glass substrate or multiple types of insulating substrates. As another example, the phase shifting circuit may be implemented using passive circuit elements such as microstrip lines. The phase shifting circuit and the radiating element may be formed or layouted on the same passive substrate.

As those skilled in the art can appreciate the operation of the method 2600 after reading the above paragraphs directed to FIG. 1 through FIG. 24, further description is omitted here for brevity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A phased array transmitter, comprising:

a plurality of signal couplers, arranged to receive an RF input signal;

a plurality of RF transmitters, coupled to the signal couplers, and each of the RF transmitters comprising:

a radiating element, arranged to receive a plurality of electrical signals to produce an RF output signal;

a chip having an amplifier circuit, wherein the amplifier circuit is configured to amplify the RF input signal to generate a plurality of amplified signals at a plurality of output terminals, respectively; and a phase shifting circuit, located outside the chip and coupled to the output terminals and the radiating element, the phase shifting circuit being arranged to phase shift the amplified signals, and accordingly generate the electrical signals fed to the radiating element;

wherein respective phase shifting circuits and respective radiating elements of the RF transmitters are formed on a same substrate.

2. The phased array transmitter of claim 1, wherein respective chips of the RF transmitters are heterogeneously integrated onto the substrate.

3. The phased array transmitter of claim 1, wherein the radiating element comprises:

a first feeding point, arranged to receive a first electrical signal of the electrical signals; and a second feeding point, arranged to receive a second electrical signal of the electrical signals, wherein the first electrical signal and the second electrical signal are of equal amplitude, and have a phase difference of 90 degrees.

4. The phased array transmitter of claim 3, wherein the amplified signals comprise a first amplified signal and a second amplified signal; the phase shifting circuit comprises:

a first phase shifting stage, coupled to the output terminals, the first phase shifting stage being configured to phase shift at least one of the first amplified signal and the second amplified signal to produce a first phase shifted signal and a second phase shifted signal having a phase difference of 90 degrees, and combine the first phase shifted signal and the second phase shifted signal to generate a combined signal; and a second phase shifting stage, coupled to the first phase shifting stage, the second phase shifting stage being configured to phase shift the combined signal to produce the first electrical signal and the second electrical signal.

5. The phased array transmitter of claim 4, wherein the first phase shifting stage comprises:

a branch-line coupler, having a first input terminal, a second input terminal, a first output terminal and a second output terminal, wherein the first input terminal and the second input terminal are arranged to receive the first amplified signal and the second amplified signal respectively, the first output terminal is arranged to output the combined signal, and the second output terminal is isolated.

6. The phased array transmitter of claim 4, wherein the second phase shifting stage comprises:

a first transmission line, arranged to couple the combined signal to the radiating element, and accordingly generate the first electrical signal; and a second transmission line, arranged to couple the combined signal to the radiating element, and accordingly generate the second electrical signal, wherein a length of the second transmission line is greater than a length of the first transmission line.

7. The phased array transmitter of claim 3, wherein the amplified signals comprises a first amplified signal, a second amplified signal, a third amplified signal and a fourth amplified signal; the phase shifting circuit comprises:

a first phase shifting stage, configured to phase shift at least one of the first amplified signal and the second amplified signal to produce a first phase shifted signal and a second phase shifted signal having a phase difference of 90 degrees, and combine the first phase shifted signal and the second phase shifted signal to generate the first electrical signal; and a second phase shifting stage, configured to phase shift at least one of the third amplified signal and the fourth amplified signal to produce a third phase shifted signal and a fourth phase shifted signal having a phase difference of 90 degrees, and combine the third phase shifted signal and the fourth phase shifted signal to generate the second electrical signal.

8. The phased array transmitter of claim 7, wherein the first phase shifting stage comprises:

a branch-line coupler, having a first input terminal, a second input terminal, a first output terminal and a second output terminal, wherein the first input terminal and the second input terminal are arranged to receive the first amplified signal and the second amplified signal respectively, the first output terminal is arranged to output the first electrical signal, and the second output terminal is isolated.

9. The phased array transmitter of claim 7, wherein the amplifier circuit comprises:

a first amplifier path, configured to amplify the RF input signal with a first gain value to generate the first amplified signal;

a second amplifier path, configured to amplify the RF input signal with a second gain value to generate the second amplified signal;

a third amplifier path, configured to amplify the RF input signal with a third gain value to generate the third amplified signal; and a fourth amplifier path, configured to amplify the RF input signal with a fourth gain value to generate the fourth amplified signal;

wherein when the first gain value is opposite of the fourth gain value, and the second gain value is equal to the third gain value, the RF output signal outputted from the radiating element is circularly polarized in one direction; when the first gain value is equal to the fourth gain value, and the second gain value is opposite of the third gain value, the RF output signal outputted from the radiating element is circularly polarized in another direction.

10. The phased array transmitter of claim 3, wherein the radiating element further comprises:

a third feeding point, arranged to receive a third electrical signal of the electrical signals; and a fourth feeding point, arranged to receive a fourth electrical signal of the electrical signals, wherein the third electrical signal and the fourth electrical signal are of equal amplitude, and have a phase difference of 90 degrees;

wherein the RF output signal is a circularly polarized signal comprising a horizontal component and a vertical component; the radiating element is arranged to generate the horizontal component of the circularly polarized signal according to the first electrical signal and the third electrical signal, and generate the vertical component of the circularly polarized signal according to the second electrical signal and the fourth electrical signal.

11. The phased array transmitter of claim 10, wherein the amplified signals comprise a first amplified signal, a second amplified signal, a third amplified signal and a fourth amplified signal; the phase shifting circuit comprises:

a first transmission line, arranged to couple the first amplified signal to the radiating element, and accordingly generate the first electrical signal;

a second transmission line, arranged to couple the second amplified signal to the radiating element, and accordingly generate the second electrical signal, wherein a length of the first transmission line is greater than a length of the second transmission line;

a third transmission line, arranged to couple the third amplified signal to the radiating element, and accordingly generate the third electrical signal; and a fourth transmission line, arranged to couple the fourth amplified signal to the radiating element, and accordingly generate the fourth electrical signal, wherein a length of the fourth transmission line is greater than a length of the third transmission line.

12. The phased array transmitter of claim 10, wherein the amplified signals comprise a first amplified signal, a second amplified signal, a third amplified signal and a fourth amplified signal; the amplifier circuit comprises:

a first amplifier path, configured to amplify the RF input signal with a first gain value to generate the first amplified signal;

a second amplifier path, configured to amplify the RF input signal with a second gain value to generate the second amplified signal;

a third amplifier path, configured to amplify the RF input signal with a third gain value to generate the third amplified signal; and a fourth amplifier path, configured to amplify the RF input signal with a fourth gain value to generate the fourth amplified signal;

wherein when the first gain value is equal to the second gain value, and the third gain value is opposite of the fourth gain value, the RF output signal outputted from the radiating element is circularly polarized in one direction; when the first gain value is opposite of the second gain value, and the third gain value is equal to the fourth gain value, the RF output signal outputted from the radiating element is circularly polarized in another direction.

13. The phased array transmitter of claim 1, wherein the radiating elements and the phase shifting circuits are passive devices formed on the substrate.

14. The phased array transmitter of claim 1, wherein the substrate is a passive substrate.

15. The phased array transmitter of claim 1, wherein the substrate is a glass substrate.

16. The phased array transmitter of claim 1, wherein respective chips of the RF transmitters are actives devices heterogeneously integrated onto the substrate.

17. The phased array transmitter of claim 1, wherein the signal couplers are configured in a binary tree configuration, and each of the signal couplers is a power splitter.

18. The phased array transmitter of claim 1, further comprising:

a plurality of transmission lines, each coupled to a row of RF transmitters;

wherein at least one signal coupler is coupled to two transmission lines for transmitting power splitting RF signals to the two transmission lines.

19. The phased array transmitter of claim 18, further comprising:

an RF port, arranged to receive the RF input signal;

wherein at least one signal coupler is coupled to the RF port for power splitting the RF input signal.

20. The phased array transmitter of claim 18, further comprising:

a plurality of resistive elements, coupled to the transmission lines respectively, wherein each of the resistive elements is arranged to couple a terminal of a corresponding transmission line to a ground voltage.

* * * * *